US012685217B2

(12) United States Patent
Onoko et al.

(10) Patent No.: US 12,685,217 B2
(45) Date of Patent: Jul. 14, 2026

(54) SEMICONDUCTOR MODULE MANUFACTURING METHOD, ELECTRONIC EQUIPMENT MANUFACTURING METHOD, SEMICONDUCTOR MODULE, AND ELECTRONIC EQUIPMENT

(71) Applicant: CANON KABUSHIKI KAISHA, Tokyo (JP)

(72) Inventors: Kana Onoko, Kanagawa (JP); Takashi Aoki, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 501 days.

(21) Appl. No.: 17/545,040

(22) Filed: Dec. 8, 2021

(65) Prior Publication Data

US 2022/0102330 A1     Mar. 31, 2022

Related U.S. Application Data

(63) Continuation of application No. PCT/JP2020/022914, filed on Jun. 10, 2020.

(30) Foreign Application Priority Data

Jun. 14, 2019     (JP) ................................. 2019-110913
May 20, 2020     (JP) ................................. 2020-088291

(51) Int. Cl.
    *H10W 90/00*          (2026.01)
    *H10W 72/00*          (2026.01)
(52) U.S. Cl.
    CPC ......... *H10W 90/00* (2026.01); *H10W 72/071* (2026.01); *H10W 90/701* (2026.01); *H10W 72/072* (2026.01)
(58) Field of Classification Search
    CPC ... H01L 25/16; H01L 21/60; H01L 23/49816; H01L 2021/60022; H10W 90/00; H10W 72/071; H10W 90/701; H10W 72/072
    See application file for complete search history.

(56) References Cited

U.S. PATENT DOCUMENTS 7,697,582 B2      4/2010 Aoki
9,648,739 B2 *    5/2017 Aoki ...................... H05K 1/111
(Continued)

FOREIGN PATENT DOCUMENTS

DE        10215100480 A1     8/2015
JP        10-163263     *    6/1996
(Continued)

OTHER PUBLICATIONS

Jun. 25, 2024 Office Action in Japanese Patent Application Pub. No. 2020-088291 (with English translation).
(Continued)

*Primary Examiner* — Benjamin Tzu-Hung Liu
(74) *Attorney, Agent, or Firm* — Venable LLP

(57)     ABSTRACT

A chip component including a first electrode and a second electrode, a semiconductor device including a first land and a second land, and a printed wiring board are prepared. A first solder paste and a second solder paste are supplied to the printed wiring board. The chip component is placed on the printed wiring board so that the first electrode is in contact with the first solder paste and the second electrode is in contact with the second solder paste. The semiconductor device is placed on the printed wiring board so that the first land faces the first electrode and the second land faces the second electrode. The solder paste is heated and melted, the first land and the first electrode are bonded to each other, and the second land and the second electrode are bonded to each other.

13 Claims, 13 Drawing Sheets

(56) References Cited

U.S. PATENT DOCUMENTS

| | | | |
|---|---|---|---|
| 2002/0159243 A1* | 10/2002 | Ogawa | H01L 23/49822 |
| | | | 361/780 |
| 2006/0108607 A1 | 5/2006 | Teshima et al. | |
| 2011/0120769 A1* | 5/2011 | Sakatani | H05K 3/3442 |
| | | | 228/199 |
| 2014/0197530 A1* | 7/2014 | Meyer | H01L 23/49833 |
| | | | 438/126 |
| 2015/0092356 A1* | 4/2015 | Yoshikawa | H05K 3/4007 |
| | | | 174/258 |
| 2015/0163925 A1* | 6/2015 | Nakatsuji | H05K 3/1225 |
| | | | 228/6.2 |
| 2015/0216054 A1 | 7/2015 | Standing | |
| 2017/0181286 A1 | 6/2017 | Campbell et al. | |
| 2018/0374790 A1 | 12/2018 | Chang et al. | |
| 2020/0051887 A1 | 2/2020 | Aoki | |

FOREIGN PATENT DOCUMENTS

| | | | |
|---|---|---|---|
| JP | H10-163263 A | | 6/1998 |
| JP | 2001-257445 A | | 9/2001 |
| JP | 2002-280704 | * | 9/2002 |
| JP | 2002-280704 A | | 9/2002 |
| JP | 2004-228364 A | | 8/2004 |
| JP | 2005-150283 | * | 6/2005 |
| JP | 2005-0150283 | * | 6/2005 |
| JP | 2005-150283 A | | 6/2005 |
| JP | 2006-173407 A | | 6/2006 |
| JP | 2018-137276 A | | 8/2018 |

OTHER PUBLICATIONS

International Search Report and Written Opinion for International Patent Application No. PCT/JP2020/022914.

Mar. 25, 2025 Office Action in Chinese Patent Application Pub. No. 202080043396.1 (with English translation).

Nov. 19, 2025 Office Action in Chinese Patent Application Pub. No. 202080043396.1.

May 11, 2026 Office Action in German Patent Application Pub. No. 11 2020 002 865.3.

* cited by examiner

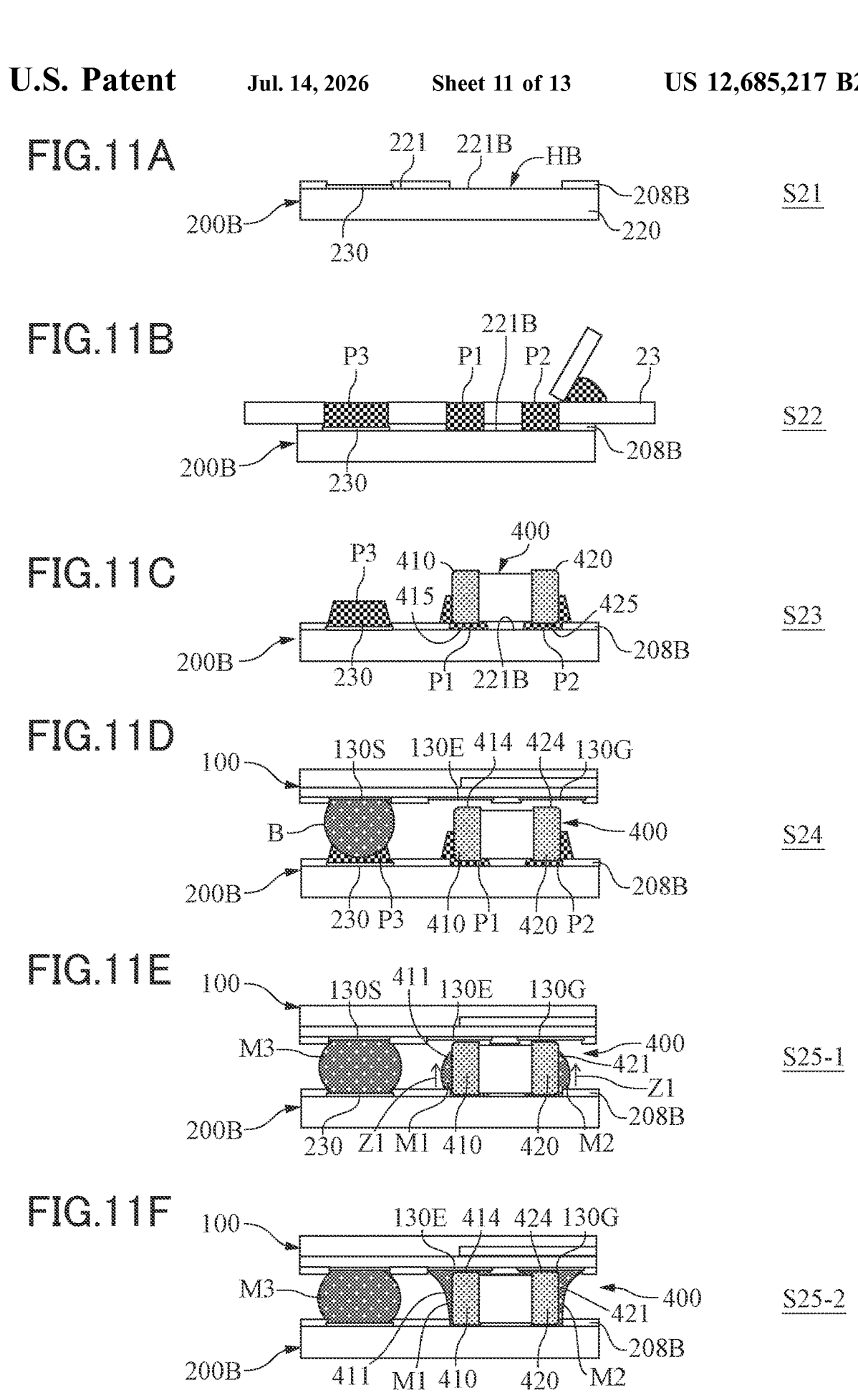

SEMICONDUCTOR MODULE MANUFACTURING METHOD, ELECTRONIC EQUIPMENT MANUFACTURING METHOD, SEMICONDUCTOR MODULE, AND ELECTRONIC EQUIPMENT

CROSS-REFERENCE TO RELATED APPLICATIONS

This application is a Continuation of International Patent Application No. PCT/JP2020/022914, filed Jun. 10, 2020, which claims the benefit of Japanese Patent Application No. 2019-110913, filed Jun. 14, 2019, and Japanese Patent Application No. 2020-088291, filed May 20, 2020 which are hereby incorporated by reference herein in their entirety.

BACKGROUND OF THE INVENTION

Field of the Invention

The present invention relates to a technology of a semiconductor module having a semiconductor device.

Description of the Related Art

Electronic equipment such as a mobile device includes a semiconductor module including a semiconductor device that communicates with another semiconductor device such as a memory and a printed wiring board on which the semiconductor device is mounted. A semiconductor device is a semiconductor package including a semiconductor element and a package substrate. An arrangement structure of terminals included in the semiconductor device is, for example, a ball grid array (BGA). In the electronic equipment, high-speed communication and low voltage communication of the semiconductor device have been advanced, and it is required to reduce noise generated in the semiconductor device. In addition, with downsizing and thinning of the electronic equipment, it is desired to narrow the pitch between adjacent terminals in the semiconductor device.

As one of means for reducing noise, it is considered to connect a bypass capacitor between a power terminal and a ground terminal of the semiconductor device. The bypass capacitor is generally mounted on a surface adjacent to the semiconductor device in the printed wiring board or on a surface opposite to a surface on which the semiconductor device is mounted in the printed wiring board by surface mount technology (SMT). However, in this method, it is necessary to form a wire that electrically connects the semiconductor device and the capacitor on the printed wiring board, and inductance of the wire contributes to generation of noise that hinders an increase in communication speed in the semiconductor device. Meanwhile, Japanese Patent Laid-Open No. 2006-173407 discloses a technology of directly attaching the bypass capacitor to a power supply pad and a ground pad of a BGA package with solder.

However, in the technology of Japanese Patent Laid-Open No. 2006-173407, it is necessary to form a solder ball on each of a pair of electrodes of the capacitor in advance before the semiconductor device is mounted on the printed wiring board. The capacitor is a compact electronic component. For this reason, it is difficult to form the solder balls on the electrodes of the capacitor in terms of manufacturing. In addition, since a process of forming the solder balls on the electrodes of the capacitor is required, the manufacturing process increases. Therefore, it has been required to improve productivity of the semiconductor module as compared with the related art. Such a problem also occurs when a small electronic component other than the capacitor, for example, an inductor or a resistor, is connected to the semiconductor device. Further, when these electronic components are connected to a semiconductor device, bonding strength is required.

Therefore, a technology for improving the productivity of the semiconductor module has been expected. In addition, it has been expected to increase the bonding strength of the electronic component connected to the semiconductor module.

SUMMARY OF THE INVENTION

According to a first aspect of the present invention, a semiconductor module manufacturing method includes preparing a chip component including a first electrode and a second electrode disposed at intervals in a predetermined direction, a semiconductor device including a first land and a second land, and a printed wiring board, supplying a first solder paste and a second solder paste to the printed wiring board at intervals, placing the chip component on the printed wiring board such that the first electrode is in contact with the first solder paste and the second electrode is in contact with the second solder paste, placing the semiconductor device on the printed wiring board such that the first land faces the first electrode and the second land faces the second electrode, heating and melting the first solder paste and the second solder paste, and bonding the first land and the first electrode to each other with solder and bonding the second land and the second electrode to each other with solder by cooling and solidifying wet-spread molten solder to each of the first land and the second land.

According to a second aspect of the present invention, a semiconductor module includes a printed wiring board, a semiconductor device including a first land and a second land, the semiconductor device being mounted on the printed wiring board, a chip component including a first electrode and a second electrode spaced apart from each other in a predetermined direction, the chip component being disposed between the printed wiring board and the semiconductor device, a first solder bonding portion that bonds the first electrode and the first land to each other, and a second solder bonding portion that bonds the second electrode and the second land to each other. The printed wiring board includes an insulating substrate and a solder resist disposed on a main surface of the insulating substrate. The chip component faces the solder resist. Each of the first land and the second land overlaps at least a portion of each of the first electrode and the second electrode in a plan vie and extends outward in the predetermined direction from the chip component. The first solder bonding portion has a fillet shape in which the first solder bonding portion spreads outward in the predetermined direction from the first electrode as the first solder bonding portion extends toward the first land from the solder resist. The second solder bonding portion has a fillet shape in which the second solder bonding portion spreads outward in the predetermined direction from the second electrode as the second solder bonding portion extends toward the second land from the solder resist.

According to a third aspect of the present invention, a semiconductor module includes a printed wiring board, a semiconductor device including a first land and a second land, the semiconductor device being mounted on the printed wiring board, a chip component including a first electrode and a second electrode spaced apart from each other in a predetermined direction, the chip component being disposed between the printed wiring board and the semiconductor device, a first solder bonding portion that bonds the first electrode and the first land to each other, and a second solder bonding portion that bonds the second electrode and the second land to each other. The printed wiring board includes an insulating substrate, a third land disposed on a main surface of the insulating substrate and electrically connected to the first land by the first solder bonding portion, and a fourth land disposed on the main surface of the insulating substrate and electrically connected to the second land by the second solder bonding portion. In a plan view, each of the first land and the second land overlaps at least a portion of each of the first electrode and the second electrode, overlaps at least a portion of each of the third land and the fourth land, and extends outward in the predetermined direction from the chip component. The first solder bonding portion has a fillet shape in which the first solder bonding portion spreads outward in the predetermined direction from the first electrode as the first solder bonding portion extends toward the first land from the third land. The second solder bonding portion has a fillet shape in which the second solder bonding portion spreads outward in the predetermined direction from the second electrode as the second solder bonding portion extends toward the second land from the fourth land.

According to a fourth aspect of the present invention, a semiconductor module includes a printed wiring board, a semiconductor device comprising a first land and a second land, the semiconductor device being mounted on the printed wiring board, a chip component including a first electrode and a second electrode spaced apart from each other in a predetermined direction, the chip component being disposed between the printed wiring board and the semiconductor device, a first solder bonding portion that bonds the first electrode and the first land to each other, and a second solder bonding portion that bonds the second electrode and the second land to each other. The printed wiring board includes an insulating substrate and a solder resist disposed on a main surface of the insulating substrate. The solder resist has an opening portion into which a portion of the chip component is inserted. Each of the first land and the second land overlaps at least a portion of each of the first electrode and the second electrode in a plan view and extends outward in the predetermined direction from the chip component. The first solder bonding portion has a fillet shape in which the first solder bonding portion spreads outward in the predetermined direction from the first electrode as the first solder bonding portion extends toward the first land from a portion of the main surface of the insulating substrate exposed by the opening portion of the solder resist. The second solder bonding portion has a fillet shape in which the second solder bonding portion spreads outward in the predetermined direction from the second electrode as the second solder bonding portion extends toward the second land from the portion of the main surface of the insulating substrate exposed by the opening portion of the solder resist.

Further features of the present invention will become apparent from the following description of exemplary embodiments with reference to the attached drawings.

BRIEF DESCRIPTION OF THE DRAWINGS

FIG. 5A is a diagram for explaining one stage of a processing module manufacturing method according to the first embodiment.

FIG. 5B is a diagram for explaining one stage of the processing module manufacturing method according to the first embodiment.

FIG. 5C is a diagram for explaining one stage of the processing module manufacturing method according to the first embodiment.

FIG. 5D is a diagram for explaining one stage of the processing module manufacturing method according to the first embodiment.

FIG. 5E is a diagram for explaining one stage of the processing module manufacturing method according to the first embodiment.

FIG. 5F is a diagram for explaining one stage of the processing module manufacturing method according to the first embodiment.

FIG. 11A is a diagram for explaining one stage of a processing module manufacturing method according to the third embodiment.

FIG. 11B is a diagram for explaining one stage of the processing module manufacturing method according to the third embodiment.

FIG. 11C is a diagram for explaining one stage of the processing module manufacturing method according to the third embodiment.

FIG. 11D is a diagram for explaining one stage of the processing module manufacturing method according to the third embodiment.

FIG. 11E is a diagram for explaining one stage of the processing module manufacturing method according to the third embodiment.

FIG. 11F is a diagram for explaining one stage of the processing module manufacturing method according to the third embodiment.

DESCRIPTION OF THE EMBODIMENTS

Hereinafter, modes for carrying out the present invention will be described in detail with reference to the drawings.

First Embodiment

Figure 1:
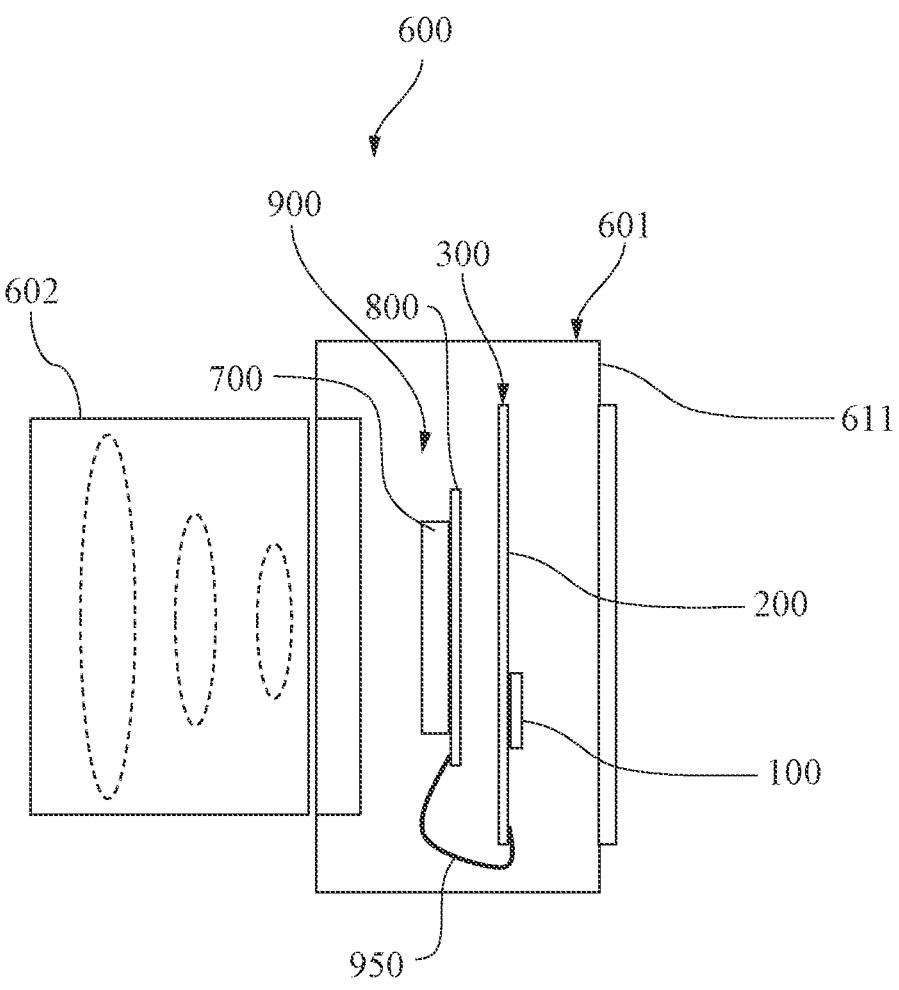
FIG. 1 is an explanatory diagram of an example of electronic equipment according to a first embodiment.

FIG. 1 is an explanatory diagram of a digital camera 600 which is an imaging device as an example of electronic equipment according to a first embodiment. The digital camera 600 as an imaging device is an interchangeable lens digital camera, and includes camera body 601. A lens unit (lens barrel) 602 including a lens is detachable from the camera body 601. The camera body 601 includes a casing 611, and a processing module 300 and a sensor module 900, which are printed circuit boards, disposed inside the casing 611. The processing module 300 is an example of a semiconductor module. The processing module 300 and the sensor module 900 are electrically connected to each other by a cable 950.

The sensor module 900 includes an image sensor 700 as an imaging element and a printed wiring board 800. The image sensor 700 is mounted on the printed wiring board 800. The image sensor 700 is, for example, a complementary metal oxide semiconductor (CMOS) image sensor or a charge coupled device (CCD) image sensor. The image sensor 700 has a function of converting light incident via the lens unit 602 into an electric signal.

The processing module 300 includes a semiconductor device 100 and a printed wiring board 200 which is a first wiring board. The semiconductor device 100 is mounted on the printed wiring board 200. The printed wiring board 200 is a rigid substrate. The semiconductor device 100 is, for example, a digital signal processor, and has a function of acquiring an electric signal from the image sensor 700, performing processing of correcting the acquired electric signal, and generating image data.

Figure 2A:
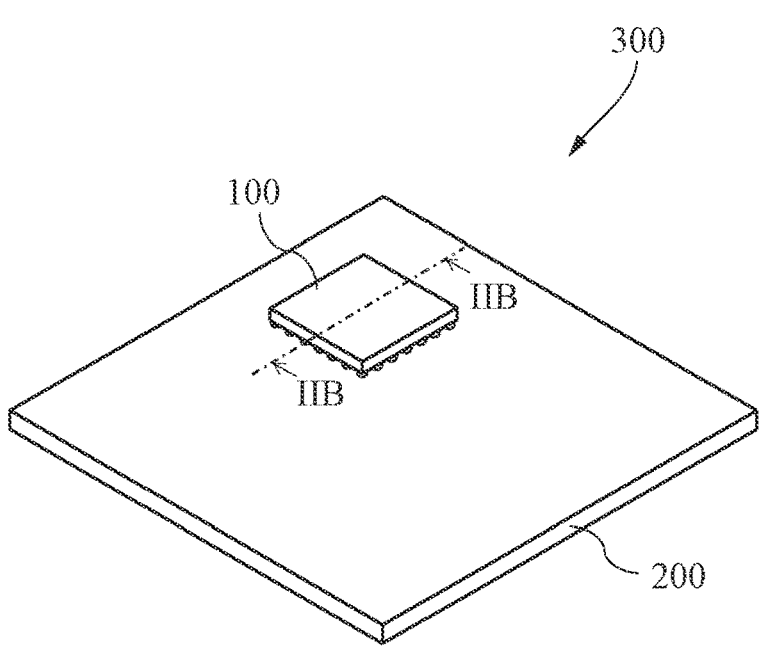
FIG. 2A is a perspective view of a processing module according to the first embodiment.
Figure 2B:
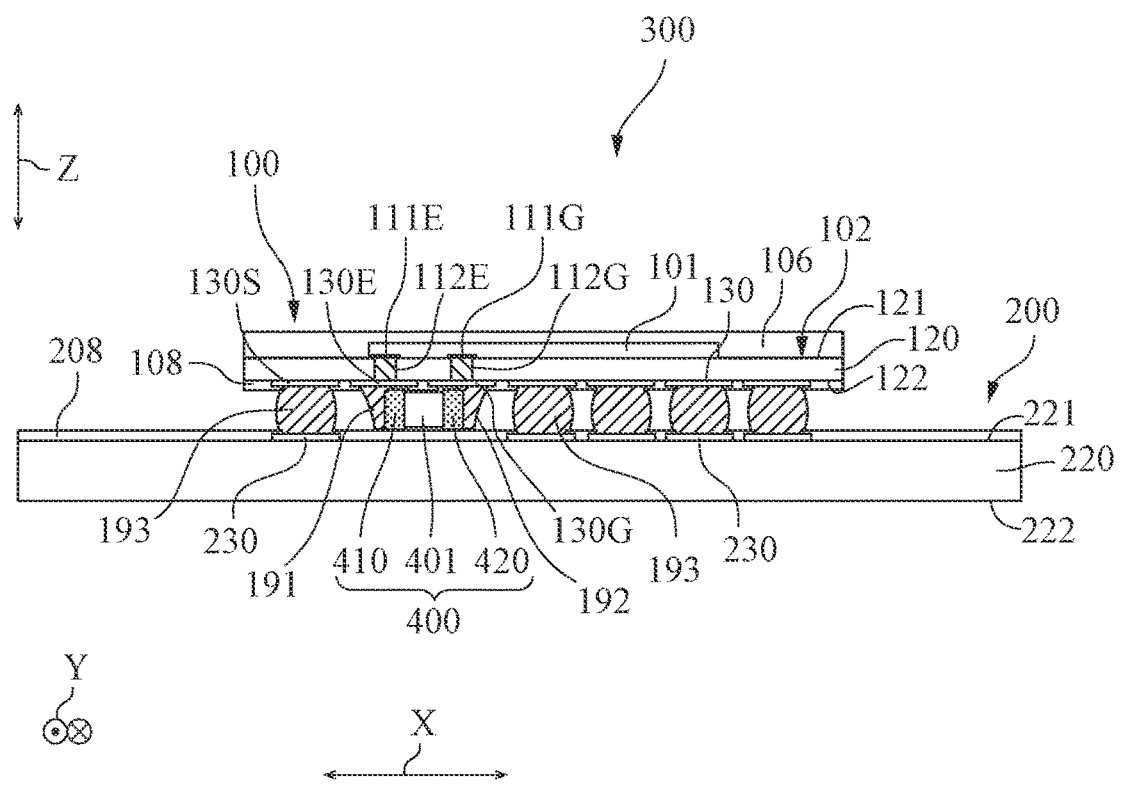
FIG. 2B is a schematic cross-sectional view of the processing module according to the first embodiment.
Figure 3:
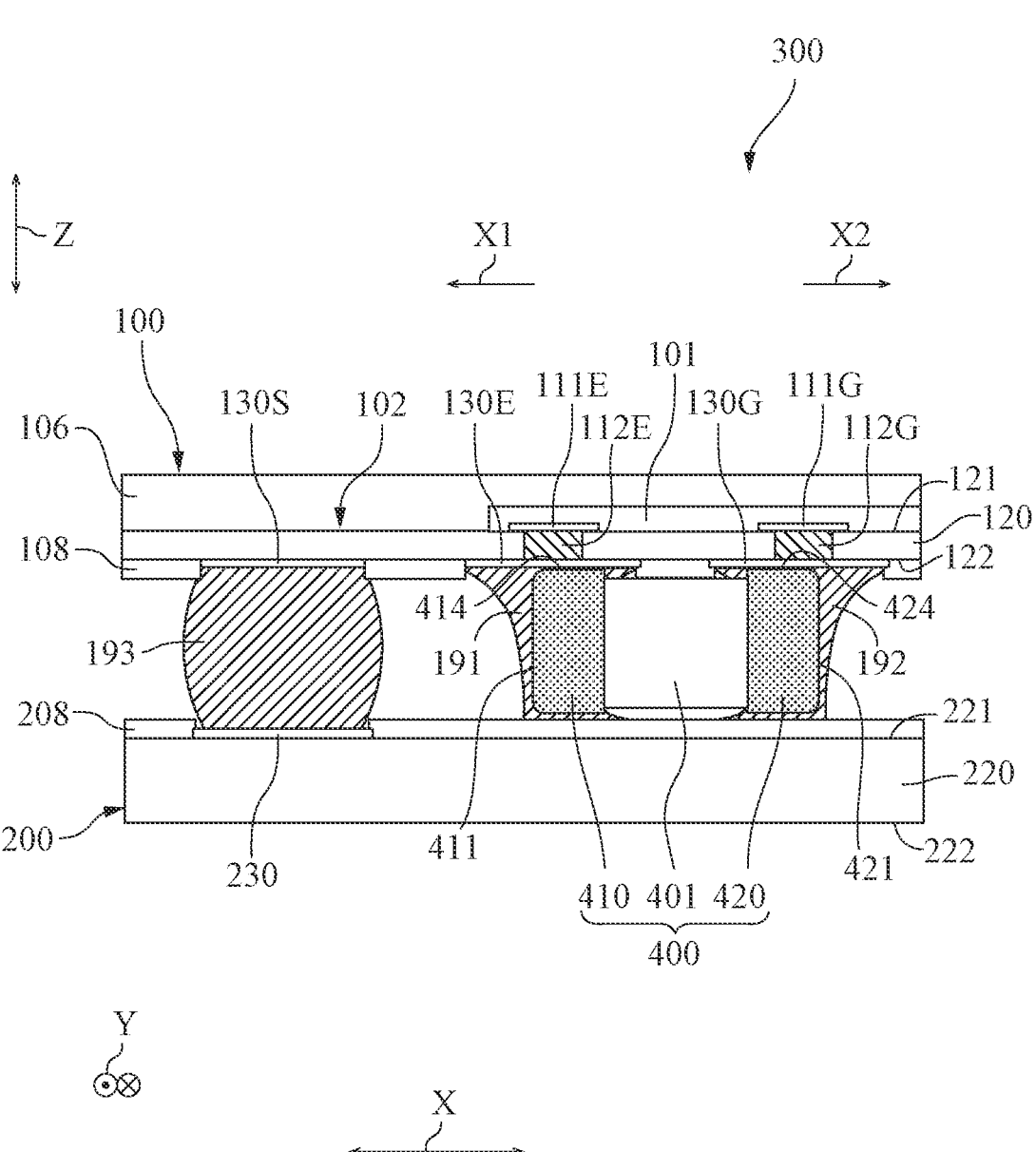
FIG. 3 is a schematic cross-sectional view in which a portion of the processing module according to the first embodiment is enlarged.

FIG. 2A is a perspective view of the processing module 300 according to the first embodiment. FIG. 2B is a schematic cross-sectional view of the processing module 300 taken along line IIB-IIB in FIG. 2A. FIG. 3 is a schematic cross-sectional view in which a portion of the processing module 300 illustrated in FIG. 2B is enlarged. Hereinafter, description will be given with reference to FIGS. 2A, 2B, and 3.

The semiconductor device 100 is an area array semiconductor package, and is a BGA semiconductor package in the first embodiment. The semiconductor device 100 includes a semiconductor element 101 and a package substrate 102 which is a second wiring board. The package substrate 102 is a rigid substrate.

The semiconductor element 101 is mounted on the package substrate 102. The package substrate 102 includes an insulating substrate 120. The insulating substrate 120 has a main surface 121 and a main surface 122 opposite to the main surface 121. A material of the insulating substrate 120 is, for example, ceramic such as alumina or an epoxy resin containing glass. The semiconductor element 101 is, for example, a semiconductor chip, and is mounted on the main surface 121 of the insulating substrate 120 in a face-up manner or a face-down manner, the face-down manner in the first embodiment. A sealing resin 106 for sealing the semiconductor element 101 is provided on the main surface 121 of the insulating substrate 120. The package substrate 102 has a plurality of lands 130 disposed on the main surface 122 of the insulating substrate 120. An arrangement pattern of the plurality of lands 130 may have a lattice shape, that is, a matrix shape, or a staggered shape. The land 130 is a terminal made of a conductive metal material such as copper or gold, and is, for example, a signal terminal, a power terminal, a ground terminal, or a dummy terminal. A solder resist 108 is provided on the main surface 122. The solder resist 108 is a film made of a solder resist material. Each of the plurality of lands 130 is exposed through an opening portion formed in the solder resist 108. The land 130 may be a land of either a solder mask defined (SMD) or a non-solder mask defined (NSMD), but is a land of SMD in the first embodiment. Although not illustrated, a heat sink may be disposed on the upper surface of the semiconductor element 101.

The semiconductor element 101 includes a plurality of power terminals, a plurality of ground terminals, and a plurality of signal terminals, and each terminal is bonded to the package substrate 102 by wire bonding or flip chip bonding (not illustrated). FIGS. 2B and 3 illustrate a power terminal 111E, which is one of the plurality of power terminals, and illustrate a ground terminal 111G, which is one of the plurality of ground terminals. That is, the semiconductor element 101 includes the power terminal 111E and the ground terminal 111G.

The printed wiring board 200 includes insulating substrate 220. The insulating substrate 220 has a main surface 221 and a main surface 222 opposite to the main surface 221. The printed wiring board 200 has a plurality of lands 230 disposed on main surface 221 of the insulating substrate 220. The land 230 is a terminal made of a conductive metal material such as copper or gold, and is, for example, a signal terminal, a power terminal, a ground terminal, or a dummy terminal. A material of the insulating substrate 220 is an insulating material such as an epoxy resin.

The printed wiring board 200 includes a solder resist 208. The solder resist 208 is a film made of a solder resist material. The solder resist 208 is provided on the main surface 221. Each of the plurality of lands 230 is exposed through an opening portion formed in the solder resist 208.

The land 230 may be either an SMD or an NSMD land, but is an SMD land in the first embodiment.

The plurality of lands 130 include a land 130E serving as a power terminal and a land 130G serving as a ground terminal. The plurality of lands 130 are arranged at intervals of 0.4 mm or less. The land 130E is a first land, and the land 130G is a second land. The land 130E is electrically connected to the power terminal 111E of the semiconductor element 101 via a via conductor 112E formed on the insulating substrate 120. The land 130G is electrically connected to the ground terminal 111G of the semiconductor element 101 via a via conductor 112G formed on the insulating substrate 120.

The plurality of lands 130 include a land 130S other than the lands 130E and 130G. The land 130S is a land serving as a signal terminal, a power terminal, a ground terminal, or a dummy terminal. In the first embodiment, each of the plurality of lands 130S is a fifth land, and each of the plurality of lands 230 is a sixth land. The land 130S and the land 230 are bonded to each other by solder bonding portion 193 that is a third solder bonding portion made of solder. A height of the solder bonding portion 193 is higher than a height of a capacitor 400 described later. Specifically, the height is 1.3 times or less the height of the capacitor. This is because warpage occurs from a center toward an outer peripheral edge of the semiconductor element 101 during a thermal bonding process.

The processing module 300 includes a capacitor 400 which is an example of a chip component. The capacitor 400 is a passive component and is a chip component. A size of the chip component in a plan view is preferably 0402 size or less, such as 0402 size of 0.4 mm×0.2 mm or 0201 size of 0.25 mm×0.125 mm. Notations such as 0402 size and 0201 size conform to the size notation method (mm standard) of electronic components in Japanese Industrial Standards.

The capacitor 400 includes an element body 401 having a substantially rectangular parallelepiped shape extending in a longitudinal direction as an example of a predetermined direction, and a pair of electrodes 410 and 420 provided on both sides of the element body 401 in the longitudinal direction. The pair of electrodes 410 and 420 is fixed to the element body 401 at intervals in the longitudinal direction. In FIGS. 2B and 3, the longitudinal direction of the capacitor 400, that is, the element body 401 is an X direction. A short direction of the capacitor 400, that is, the element body 401 is a Y direction. The Y direction is a width direction orthogonal to the X direction. A vertical direction of the capacitor 400, that is, the element body 401 is a Z direction. The Z direction is a direction orthogonal to the X direction and the Y direction. The Z direction is also a direction perpendicular to the main surfaces 121, 122, 221, and 222.

One electrode 410 of the pair of electrodes 410 and 420 is a first electrode, and the other electrode 420 is a second electrode. Each of the electrodes 410 and 420 includes a base and an outer film covering the base. A material of the outer film of the electrode 410,420 is a conductive metal material such as tin.

The capacitor 400 is a bypass capacitor. The electrode 410 of the capacitor 400 is electrically connected to the land 130E, and the electrode 420 of the capacitor 400 is electrically connected to the land 130G.

A power supply noise is generated by an inductance of a wire between the electrode 410 of the capacitor 400 and the power terminal 111E and an inductance of a wire between the electrode 420 of the capacitor 400 and the ground terminal 111G. The power supply noise refers to a voltage fluctuation of a power supply line caused by the operation of the semiconductor device 100. This voltage fluctuation occurs when a power supply current changes due to an inductance or a resistance parasitic in the power supply line. In order to reduce the power supply noise by reducing the inductance of the wire, the capacitor 400 is preferably disposed immediately below the semiconductor element 101 so that the wire between the capacitor 400 and the power terminal 111E and the wire between the capacitor 400 and the ground terminal 111G of the semiconductor device 100 are minimized. That is, it is preferable that the semiconductor element 101 and the capacitor 400 overlap in a plan view of the processing module 300 from the semiconductor device 100 side.

Therefore, in the first embodiment, the capacitor 400 is disposed on the main surface 221 side of the insulating substrate 220 of the printed wiring board 200, that is, between the semiconductor device 100 and the printed wiring board 200. The electrode 410 of the capacitor 400 is bonded to the land 130E by a solder bonding portion 191 which is a first solder bonding portion formed of solder. The electrode 420 of capacitor 400 is bonded to the land 130G by a solder bonding portion 192 which is a second solder bonding portion made of solder. Accordingly, the electrode 410 of the capacitor 400 is electrically connected directly to the land 130E of the semiconductor device 100 by the solder bonding portion 191 without the printed wiring board 200 interposed therebetween. Therefore, the inductance of the wire between the electrode 410 of the capacitor 400 and the land 130E can be reduced. Further, the electrode 420 of the capacitor 400 is electrically connected to the land 130G of the semiconductor device 100 directly by the solder bonding portion 192 without the printed wiring board 200 interposed therebetween. Therefore, the inductance of the wire between the electrode 420 of the capacitor 400 and the land 130G can be reduced. Since the inductance of the wire is reduced, the generated power supply noise is reduced, and a speed of communication in the semiconductor device 100 can be increased.

In the first embodiment, the solder bonding portions 191 and 192 are in contact with the solder resist 208, but are not in contact with the land 230 of the printed wiring board 200.

Figure 4A:
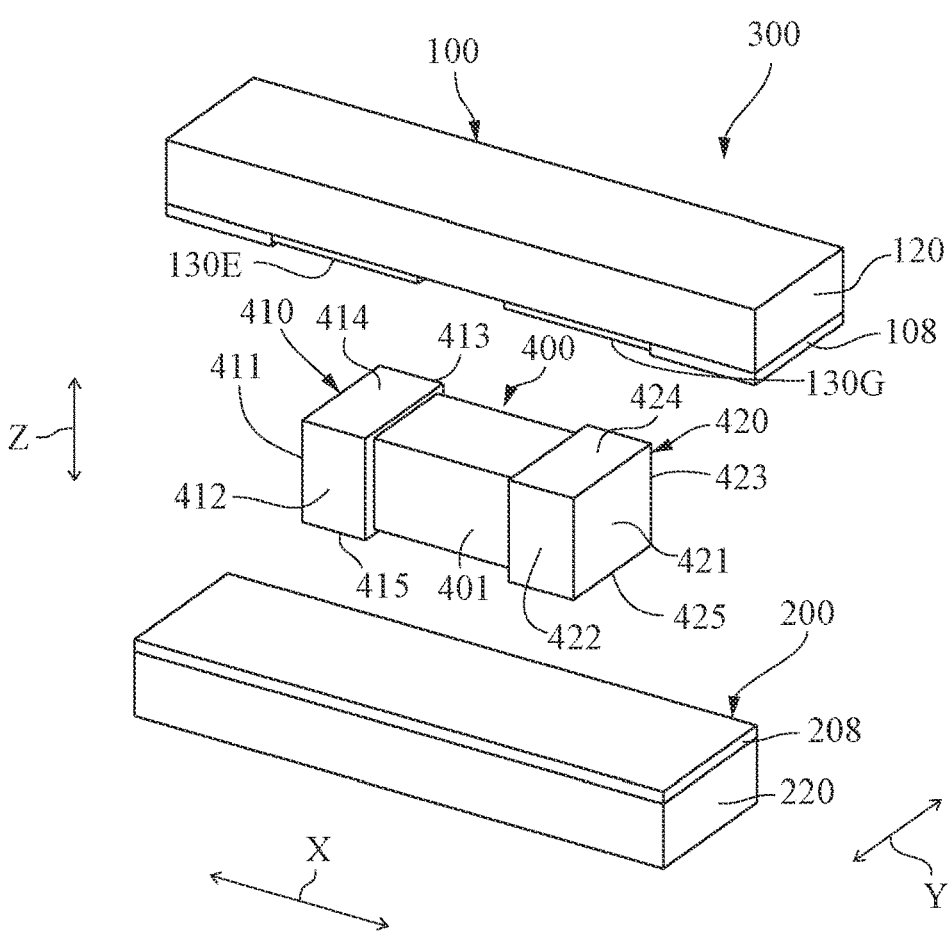
FIG. 4A is an exploded partial perspective view of the processing module according to the first embodiment.
Figure 4B:
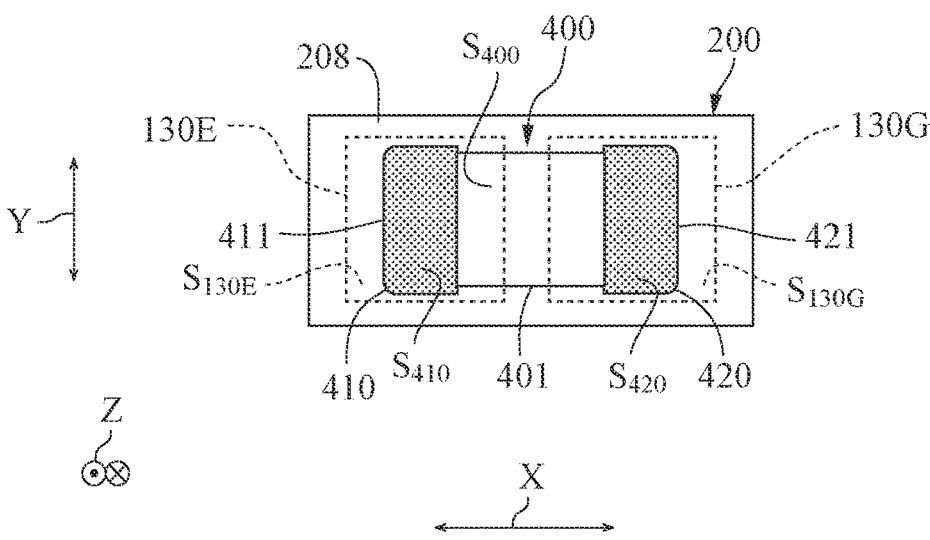
FIG. 4B is a schematic diagram for explaining an arrangement relationship among a semiconductor device, a capacitor, and a printed wiring board according to the first embodiment.

FIG. 4A is an exploded partial perspective view of the processing module 300 according to the first embodiment. FIG. 4B is a schematic diagram for explaining an arrangement relationship of the semiconductor device 100, capacitor 400, and printed wiring board 200 when viewed in the Z direction. In FIGS. 4A and 4B, illustrations of solder bonding portions 191 and 192 are omitted. In FIG. 4B, the lands 130E and 130G of the semiconductor device are indicated by broken lines.

As illustrated in FIG. 4A, the electrode 410 has three side surfaces 411, 412, and 413, an upper surface 414, and a lower surface 415, which are electrode surfaces. The side surfaces 411, 412, and 413, the upper surface 414, and the lower surface 415 have rectangular shapes when viewed from a direction perpendicular to each surface. Among the three side surfaces 411, 412, and 413, the two side surfaces 412 and 413 face each other at an interval in the Y direction. The upper surface 414 and the lower surface 415 face each other at an interval in the Z direction. The side surface 411 is orthogonal to and adjacent to the side surfaces 412 and 413, the upper surface 414, and the lower surface 415. The electrode 420 has three side surfaces 421, 422, and 423, an upper surface 424, and a lower surface 425 which are electrode surfaces. The side surfaces 421, 422, and 423, the upper surface 424, and the lower surface 425 have rectangular shapes when viewed from a direction perpendicular to each surface. Among the three side surfaces 421, 422, and 423, the two side surfaces 422 and 423 face each other at an interval in the Y direction. The upper surface 424 and the lower surface 425 face each other at an interval in the Z direction. The side surface 421 is orthogonal to and adjacent to the side surfaces 422 and 423, the upper surface 424, and the lower surface 425. The side surface 411 of the electrode 410 and the side surface 421 of the electrode 420 are arranged to face each other at an interval in the X direction. The upper surface 414 of the electrode 410 faces the land 130E of the semiconductor device 100, and the lower surface 415 of the electrode 410 faces the solder resist 208 of the printed wiring board 200. The upper surface 424 of the electrode 420 faces the land 130G of the semiconductor device 100, and the lower surface 425 of the electrode 420 faces the solder resist 208 of the printed wiring board 200.

As illustrated in FIG. 4B, the land 130E and the land 130G are arranged at intervals in the X direction. The land 130E overlaps at least a portion of the electrode 410 of the capacitor 400, the entire electrodes 410 in the first embodiment in a plan view, that is, when viewed in the Z direction. The land 130G overlaps at least a portion of the electrode 420 of the capacitor 400, the entire electrode 420 in the first embodiment when viewed in the Z direction. In the first embodiment, an area $S_{130E}$ of the land 130E is larger than an area $S_{410}$ of the electrode 410 as viewed in the Z direction. When viewed in the Z direction, an area $S_{130G}$ of the land 130G is larger than an area $S_{420}$ of the electrode 420. The land 130E and the land 130G extend outward in the X direction from the capacitor 400 when viewed in the Z direction.

As illustrated in FIG. 3, each of the solder bonding portions 191 and 192 has a fillet shape in which the outer surface spreads away from the capacitor 400 from the solder resist 208 toward each of the lands 130E and 130G. More specifically, the solder bonding portion 191 has a fillet shape in which the solder bonding portion 191 expands outward in the X direction from the electrode 410, that is, in the X1 direction, as the solder bonding portion 191 extends from the solder resist 208 toward the land 130E. The solder bonding portion 192 has a fillet shape in which the solder bonding portion 192 expands outward in the X direction from the electrode 420, that is, in the X2 direction, as the solder bonding portion 192 extends from the solder resist 208 toward the land 130G. The X1 direction is a direction away from the electrode 410 in the X direction. The X2 direction is a direction opposite to the X1 direction in the X direction and is a direction away from the electrode 420. As a result, the bonding strength between each of the lands 130E and 130G and each of the electrodes 410 and 420 increases. Further, as illustrated in FIG. 2B, each of the solder bonding portions 191 and 192 is prevented from having a shape bulging in the X direction, and each of the solder bonding portions 191 and 192 is prevented from being short-circuited with the adjacent solder bonding portion 193.

As illustrated in FIG. 4B, each of the lands 130E and 130G has a rectangular shape when viewed in the Z direction, but is not limited thereto. For example, the lands 130E and 130G may have any shape such as a polygonal shape, a circular shape, or an elliptical shape when viewed in the Z direction.

Figures 5A, 5B, 5C, 5D, 5E, 5F:
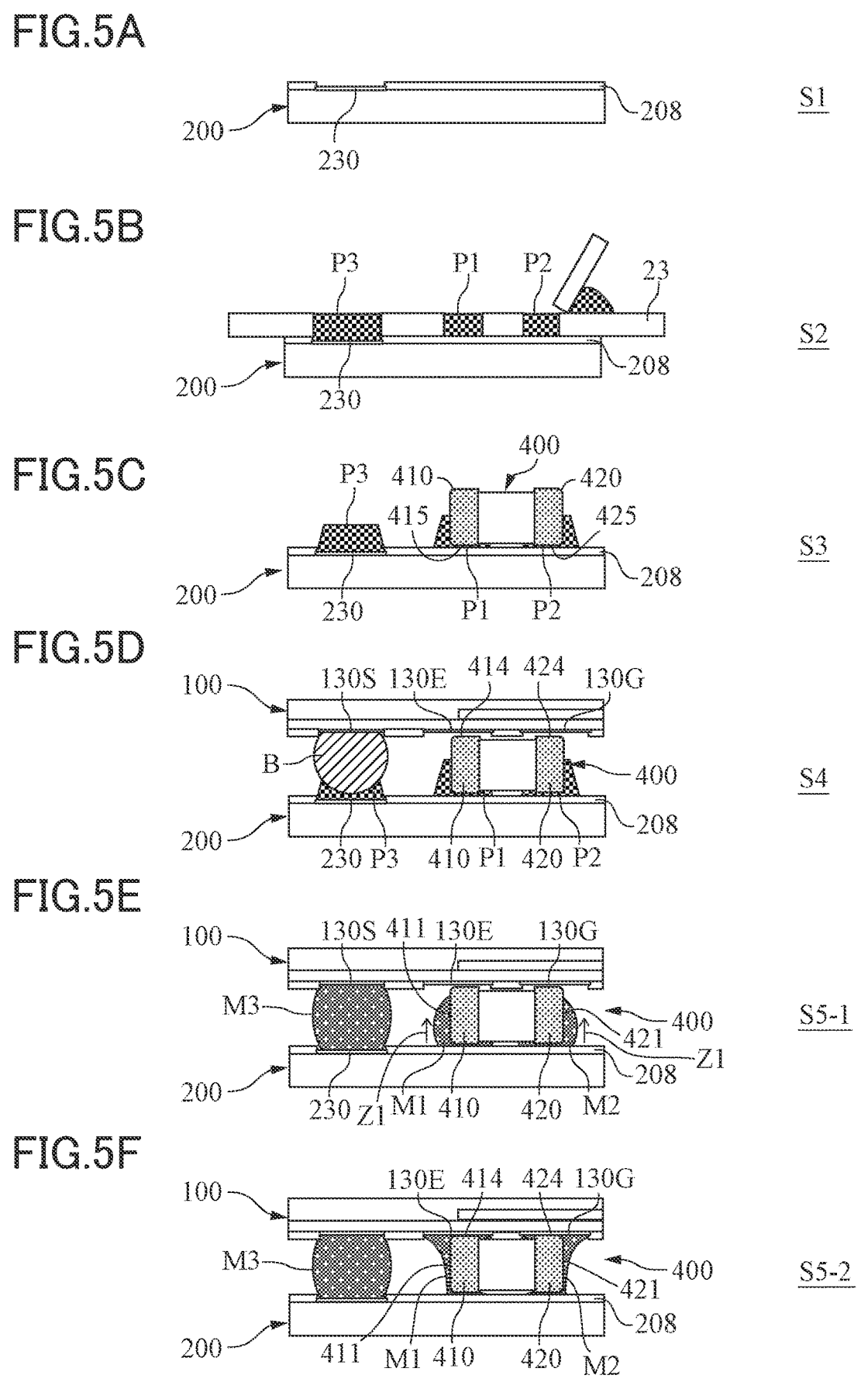

Next, a method of manufacturing the processing module 300 will be described. FIGS. 5A to 5F are explanatory diagrams of the method of manufacturing the processing module 300 according to the first embodiment. As illustrated in FIG. 5A, the printed wiring board 200 is prepared (Step S1). In Step S1, the semiconductor device 100 and the capacitor 400 are also prepared. Next, as illustrated in FIG. 5B, a solder paste P1 as a first solder paste, a solder paste P2 as a second solder paste, and a solder paste P3 as a third solder paste are supplied onto the printed wiring board 200 at intervals (Step S2). In the first embodiment, in Step S2, the solder paste P1 and the solder paste P2 are supplied onto the solder resist 208. In Step S2, the solder paste P3 is supplied onto the land 230 of the printed wiring board 200.

The solder pastes P1, P2, and P3 contain solder powder. The solder pastes P1, P2, and P3 may further contain a flux component necessary for soldering. In the present embodiment, the solder pastes P1, P2, and P3 are all the same material, but are not limited to the same material as long as the solder pastes P1, P2, and P3 have close melting point. In Step S2, the solder pastes P1, P2, and P3 are supplied to the printed wiring board 200 by screen printing using the metal mask 23. The method for supplying the solder pastes P1, P2, and P3 is not limited thereto. For example, the solder pastes P1, P2, and P3 may be supplied to the printed wiring board 200 by a dispenser.

Next, as illustrated in FIG. 5C, the capacitor 400 prepared in Step S1 is placed on the printed wiring board 200 such that the electrode 410 is in contact with the solder paste P1 and the electrode 420 is in contact with the solder paste P2 (Step S3). As a result, the lower surface 415 of the electrode 410 comes into contact with the solder paste P1, and the lower surface 425 of the electrode 420 comes into contact with the solder paste P2. It is not necessary to attach solder balls to the electrodes 410 and 420 of the capacitor 400 in advance. In Step S3, the capacitor 400 is mounted on the printed wiring board 200 using a mounter (not illustrated). At this time, the capacitor 400 is positioned and placed on the printed wiring board such that the electrode 410 and the solder paste P1 face each other and the electrode 420 and the solder paste P2 face each other.

Next, as illustrated in FIG. 5D, the semiconductor device 100 prepared in Step S1 is mounted on the printed wiring board 200 such that the land 130E faces the electrode 410 and the land 130G faces the electrode 420 (Step S4). In Step S4, the semiconductor device 100 is mounted on the printed wiring board 200 using a mounter (not illustrated). At this time, the semiconductor device 100 is aligned and placed on the printed wiring board such that the land 130E faces the electrode 410, the land 130G faces the electrode 420, and the land 130S faces the land 230. Here, the solder balls are not provided on the lands 130E and 130G of the semiconductor device 100 prepared in Step S1, and solder balls B as ball terminals are provided on the lands 130S. Therefore, the semiconductor device 100 is placed on the printed wiring board 200 such that the center of the solder ball B coincides with the center of the land 230. In Step S4, the semiconductor device 100 is placed on the printed wiring board 200 to bring the solder balls B formed on the lands 130S into contact with the solder paste P3. In FIG. 5D, the upper surface 414 of the electrode 410 and the land 130E are not in contact with each other, and the upper surface 424 of the electrode 420 and the land 130G are not in contact with each other, but these may be contacted with others.

In Step S4, a positional relationship among the printed wiring board 200, the capacitor 400, and the semiconductor device 100 when viewed from the Z direction is as illustrated in FIG. 4B. When the capacitor 400 is placed on the printed wiring board 200, each of the land 130E and the land 130G of the semiconductor device 100 overlaps at least a portion of each of the electrode 410 and the electrode 420 when viewed in the Z direction, and extends outward in the X direction from the capacitor 400.

Next, in a state where the semiconductor device 100 and the capacitor 400 are placed on the printed wiring board 200, the printed wiring board 200 is conveyed to a reflow furnace (not illustrated). Then, in Step S5-1 illustrated in FIG. 5E, a temperature of the atmosphere in the reflow furnace is adjusted to a temperature equal to or higher than the melting point of the solder, and the solder pastes P1, P2, and P3 and the solder ball B of FIG. 5D are melted as illustrated in FIG. 5E. The solder paste P1 is melted to form a flowable molten solder M1, and the solder paste P2 is melted to form a flowable molten solder M2. When the solder paste P3 and the solder ball B are melted, a flowable molten solder M3 is obtained.

Subsequent to Step S5-1, in Step S5-2 illustrated in FIG. 5F, heating is continued to cause the molten solders M1 and M2 to flow. Since the electrode 410,420 has better wettability of the molten solder than the solder resist 208, the molten solders M1 and M2 crawl up the side surfaces 411 and 421 in an upward direction indicated by an arrow Z1 as illustrated in FIG. 5E. Thereafter, the molten solders M1 and M2 move to the upper surfaces 414 and 424 as illustrated in FIG. 5F due to the wet-spreading property. Although not illustrated in FIG. 5E, the molten solders M1 and M2 also crawl up in the upward direction indicated by the arrow Z1 on the side surfaces 412 and 413 of the electrode 410 and the side surfaces 422 and 423 of the electrode 420.

In addition, the capacitor 400 is pushed upward toward the semiconductor device 100 by the molten solders M1 and M2, the distance between the upper surface 414 of the electrode 410 and the land 130E is narrowed, and the distance between the upper surface 424 of the electrode 420 and the land 130G is narrowed. The molten solders M1 and M2 reaching the upper surfaces 414 and 424 come into contact with the lands 130E and 130G, wet-spread on the lands 130E and 130G, and have a fillet shape in which the skirt widens as it goes from the solder resist 208 toward the lands 130E and 130G.

Thereafter, the molten solders M1 and M2 wet-spread to every corner of the lands 130E and 130G are cooled and solidified. As a result, the molten solder M1 is cooled and solidified in a fillet shape on the land 130E. The molten solder M2 is cooled and solidified in a fillet shape on the land 130G. At the same time, the molten solder M3 is also cooled and solidified. As a result, as illustrated in FIG. 3, the solder bonding portion 191 in which the land 130E and the electrode 410 are bonded by solder is formed, and the solder bonding portion 192 in which the land 130G and the electrode 420 are bonded by solder is formed. In addition, the solder bonding portion 193 in which the land 130S and the land 230 are bonded by solder is formed. As described above, the processing module 300 illustrated in FIG. 3 is manufactured.

Thereafter, the processing module 300 illustrated in FIG. 3 is housed in the casing 611 illustrated in FIG. 1, whereby the camera body 601, that is, the digital camera 600 is manufactured.

As described above, by melting the solder pastes P1 and P2 supplied to the printed wiring board 200, the solder can be supplied to the lands 130E and 130G of the semiconductor device 100 via the electrodes 410 and 420 of the capacitor 400. As a result, it is not necessary to form solder balls on the electrodes 410 and 420 of the capacitor 400 in advance, and the process of manufacturing the processing module 300 can be reduced. Therefore, since the processing module 300 can be easily manufactured, productivity of the processing module 300 is improved.

Here, when the solder wettability in the lands 130E and 130G of the semiconductor device 100 is F1, and the solder wettability in the electrodes 410 and 420 of the capacitor 400 is F2, a relationship of F1≥F2 is preferably satisfied. For example, by using gold as the material of the surface of the land 130, that is, the material of the surfaces of the lands 130E and 130G, the relationship of F1≥F2 is established, and the molten solders M1 and M2 easily wet-spread in the lands 130E and 130G. As a result, the solder bonding portions 191 and 192 tends to have a fillet shape on the lands 130E and 130G. Therefore, even when the amount of solder in the solder bonding portions 191 and 192 is reduced, the lands 130E and 130G of the semiconductor device 100 and the electrodes 410 and 420 of the capacitor 400 can be reliably connected. Accordingly, even when the lands 130 of the semiconductor device 100 are arranged at a high density, it is possible to prevent a bonding failure from occurring.

Second Embodiment

Figure 6:
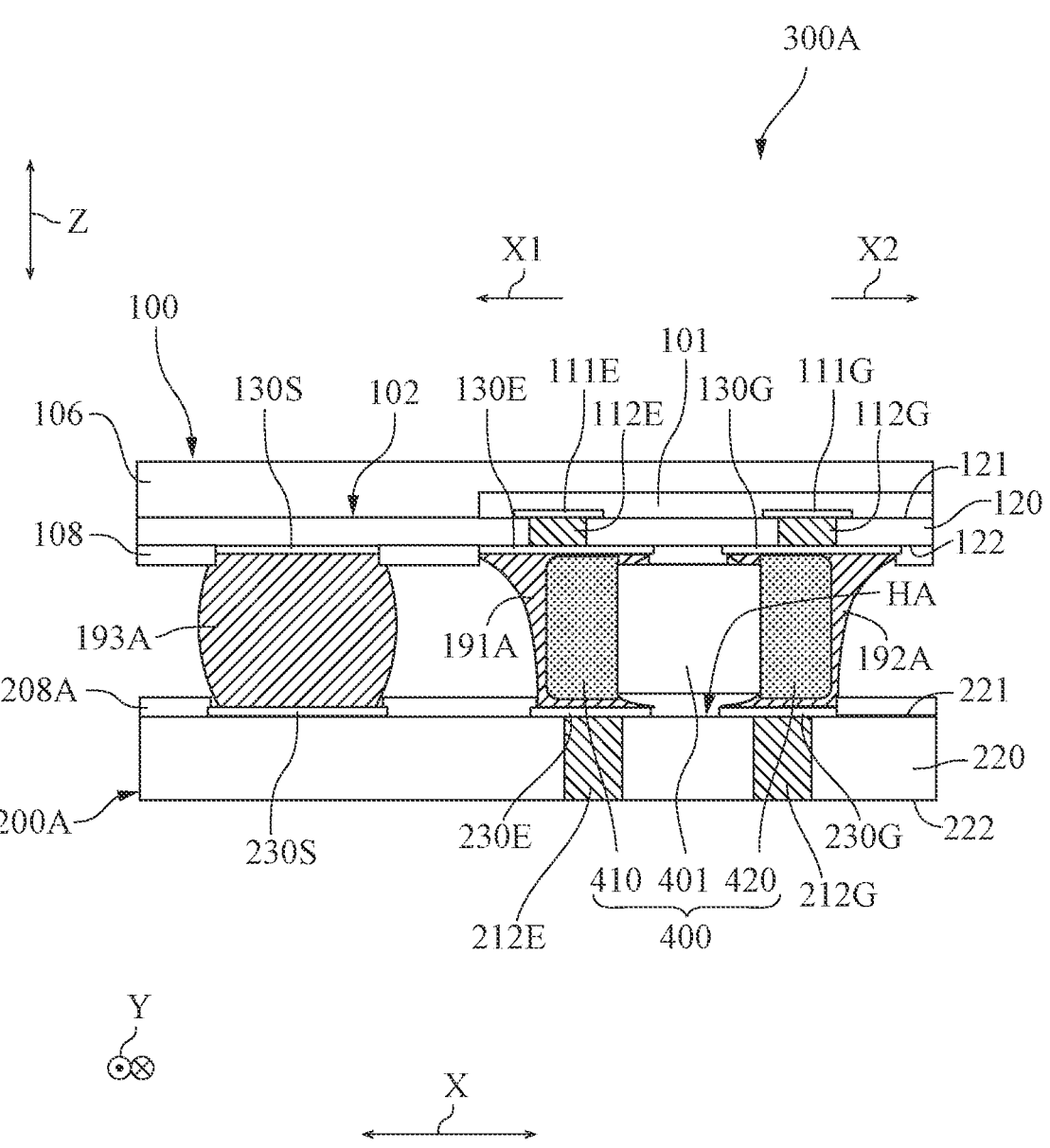
FIG. 6 is a schematic cross-sectional view in which a portion of a processing module according to a second embodiment is enlarged.

A second embodiment will be described. FIG. 6 is a schematic cross-sectional view in which a portion of a processing module according to the second embodiment is enlarged. FIG. 6 schematically illustrates a cross section of a processing module 300A according to the second embodiment. In the following description, the same components as those of the first embodiment are denoted by the same reference numerals, and detailed description thereof will be omitted.

The processing module 300A according to the second embodiment includes the semiconductor device 100 having the same configuration as that of the first embodiment and a printed wiring board 200A. Similarly to the first embodiment, the land 130E that is the first land, the land 130G that is the second land, and the land 130S that is the fifth land are arranged on the main surface 122 of the insulating substrate 120 included in the semiconductor device 100.

The printed wiring board 200A includes the insulating substrate 220 similar to that of the first embodiment. The insulating substrate 220 has a main surface 221 and a main surface 222 opposite to the main surface 221. The printed wiring board 200A includes a land 230E that is a third land, a land 230G that is a fourth land, and a land 230S that is a sixth land, which are disposed on the main surface 221 of the insulating substrate 220.

The lands 230E, 230G, and 230S are terminals formed of a conductive metal material such as copper or gold. The land 230E is a power terminal, and the land 230G is a ground terminal. The land 230S is a signal terminal, a power terminal, a ground terminal, or a dummy terminal. A via conductor 212E formed on the insulating substrate 220 is connected to the land 230E. The via conductor 212G formed on the insulating substrate 220 is connected to the land 230G.

The printed wiring board 200A includes the solder resist 208A. The solder resist 208A is a film made of a solder resist material. The solder resist 208A is provided on the main surface 221. The land 230S is exposed through an opening portion formed in the solder resist 208A. The land 230E and the land 230G are exposed by one opening portion HA formed in the solder resist 208A. Note that each of the land 230E and the land 230G may be exposed by each of two opening portions formed independently.

The land 130E and land 230E are bonded to each other by a solder bonding portion 191A that is a first solder bonding portion made of solder. The land 130G and land 230G are bonded by a solder bonding portion 192A that is a second solder bonding portion made of solder. The land 130S and land 230S are bonded to each other by a solder bonding portion 193A that is a third solder bonding portion made of solder.

The processing module 300A includes a capacitor 400 used as a bypass capacitor as in the first embodiment. The capacitor 400 is disposed on the main surface 221 side of the insulating substrate 220 of the printed wiring board 200A, that is, between the semiconductor device 100 and the printed wiring board 200A. The electrode 410 of the capacitor 400 is bonded to the land 130E by the solder bonding portion 191A. The electrode 420 of the capacitor 400 is bonded to the land 130G by the solder bonding portion 192A. Thus, the electrode 410 of the capacitor 400 is electrically connected directly to the land 130E of the semiconductor device 100 by the solder bonding portion 191A. Therefore, the inductance of the wire between the electrode 410 of the capacitor 400 and the land 130E can be reduced. Further, the electrode 420 of the capacitor 400 is electrically connected directly to the land 130G of the semiconductor device 100 by the solder bonding portion 192A. Therefore, the inductance of the wire between the electrode 420 of the capacitor 400 and the land 130G can be reduced. Since the inductance of the wire is reduced, the generated power supply noise is reduced, and a speed of communication in the semiconductor device 100 can be increased.

In the second embodiment, the land 230E is electrically connected to the land 130E by the solder bonding portion 191A. The land 230G is electrically connected to the land 130E by the solder bonding portion 192A. A power supply IC (not illustrated) electrically connected to the via conductors 212E and 212G illustrated in FIG. 6 is mounted on the printed wiring board 200A. The power supply IC can supply power to the semiconductor element 101 of the semiconductor device 100 via the solder bonding portion 191A and the solder bonding portion 192A.

Figure 7A:
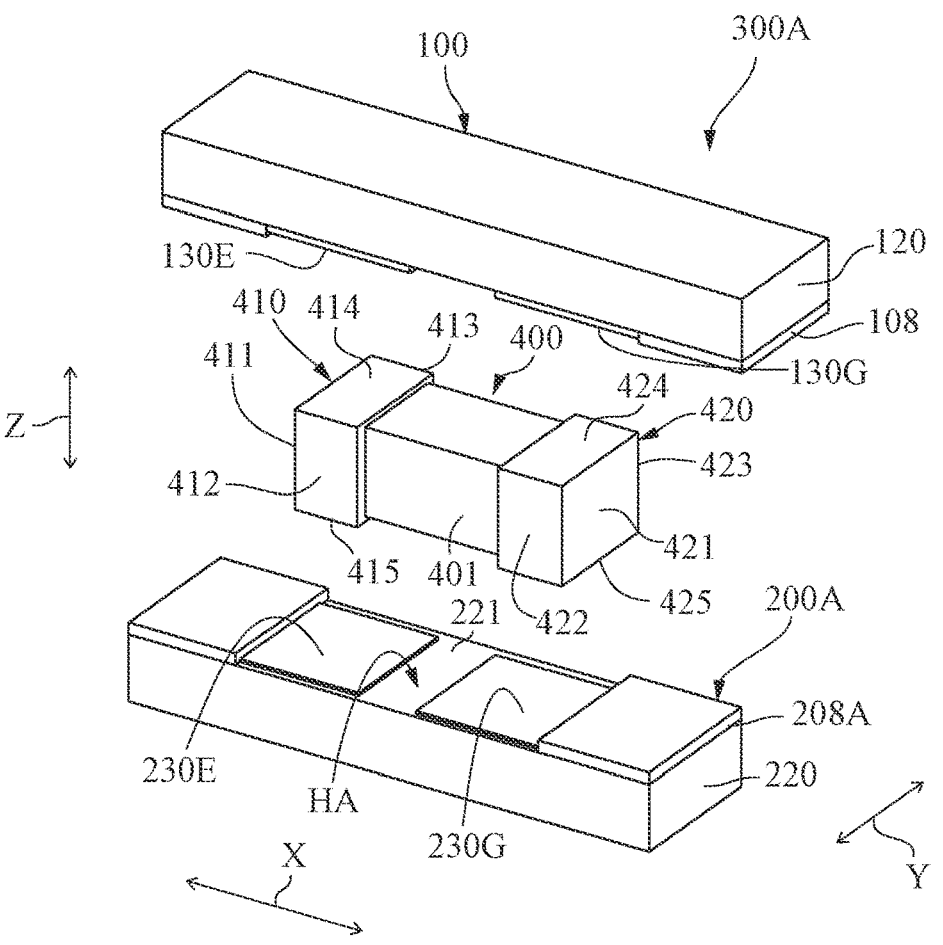
FIG. 7A is an exploded partial perspective view of a processing module according to the second embodiment.
Figure 7B:
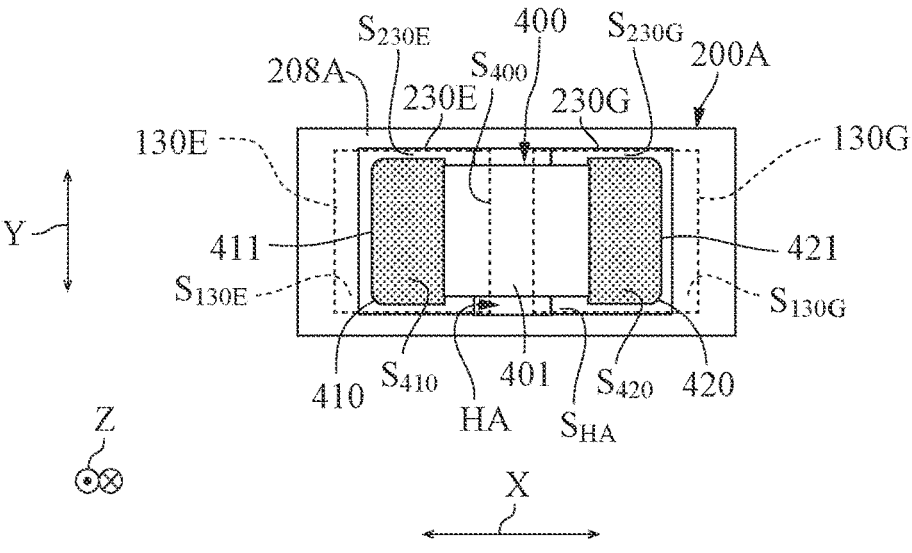
FIG. 7B is a schematic diagram for explaining an arrangement relationship among a semiconductor device, a capacitor, and a printed wiring board according to the second embodiment.

FIG. 7A is an exploded partial perspective view of the processing module 300A according to the second embodiment. FIG. 7B is a schematic diagram for explaining an arrangement relationship of the semiconductor device 100, the capacitor 400, and the printed wiring board 200A when viewed in the Z direction. In FIGS. 7A and 7B, illustrations of solder bonding portions 191A and 192A are omitted. In FIG. 7B, the lands 130E and 130G of the semiconductor device are indicated by broken lines.

As illustrated in FIG. 7A, the upper surface 414 of the electrode 410 faces the land 130E of the semiconductor device 100, and the lower surface 415 of the electrode 410 faces the land 230E of the printed wiring board 200A. The upper surface 424 of the electrode 420 faces the land 130G of the semiconductor device 100, and the lower surface 425 of the electrode 420 faces the land 230G of the printed wiring board 200A.

As illustrated in FIG. 7B, the land 130E and the land 130G are arranged at intervals in the X direction. The land 130E overlaps at least a portion of the electrode 410 of the capacitor 400, the entire electrode 410 in the second embodiment when viewed in the Z direction. The land 130G overlaps at least a portion of the electrode 420 of the capacitor 400, the entire electrode 420 in the second embodiment when viewed in the Z direction. The land 230E and the land 230G are arranged at intervals in the X direction. The land 230E overlaps at least a portion of the electrode 410 of the capacitor 400, the entire electrode 410 in the second embodiment when viewed in the Z direction. The land 230G overlaps at least a portion of the electrode 420 of the capacitor 400, the entire electrode 420 in the second embodiment when viewed in the Z direction. In addition, the land 130E overlaps at least a portion of the land 230E, the entire land 230E in the second embodiment when viewed in the Z direction. In addition, the land 130G overlaps at least a portion of the land 230G, the entire land 230G in the second embodiment as viewed in the Z direction. In the second embodiment, the area $S_{130E}$ of the land 130E is larger than the area $S_{410}$ of the electrode 410 as viewed in the Z direction. When viewed in the Z direction, an area $S_{130G}$ of the land 130G is larger than an area $S_{420}$ of the electrode 420. The land 130E and the land 130G extend outward in the X direction from the capacitor 400 when viewed in the Z direction.

In the second embodiment, as illustrated in FIG. 7B, the area $S_{130E}$ of the land 130E is larger than the area $S_{230E}$ of the land 230E when viewed in the Z direction. When viewed in the Z direction, the area $S_{130G}$ of the land 130G is larger than the area $S_{230G}$ of the land 230G. Further, when viewed in the Z direction, an area $S_{HA}$ of the opening portion HA is larger than an area $S_{400}$ of the capacitor 400.

As illustrated in FIG. 6, each of the solder bonding portions 191A and 192A has a fillet shape in which the outer surface expands away from the capacitor 400 as each of the solder bonding portions 191A and 192A extends from each of the lands 230E and 230G toward each of the lands 130E and 130G. More specifically, the solder bonding portion 191A has a fillet shape that expands outward in the X direction from the electrode 410, that is, in the X1 direction, as the solder bonding portion 191A extends from the land 230E toward the land 130E. The solder bonding portion 192A has a fillet shape that expands outward in the X direction from the electrode 410, that is, in the X2 direction, as the solder bonding portion 192A extends from the land 230G toward the land 130G. The X1 direction is a direction away from the electrode 410 in the X direction. The X2 direction is a direction opposite to the X1 direction in the X direction and is a direction away from the electrode 420. As a result, the bonding strength between each of the lands 130E and 130G and each of the electrodes 410 and 420 increases. Further, each of the solder bonding portions 191A and 192A is prevented from having a shape bulging in the X direction, and each of the solder bonding portions 191A and 192A is prevented from being short-circuited with the adjacent solder bonding portion 193A.

As illustrated in FIG. 7B, each of the lands 230E and 230G has a rectangular shape when viewed in the Z direction, but is not limited thereto. For example, the lands 230E and 230G may have any shape such as a polygonal shape, a circular shape, or an elliptical shape when viewed in the Z direction.

Figures 8A, 8B, 8C, 8D, 8E, 8F:
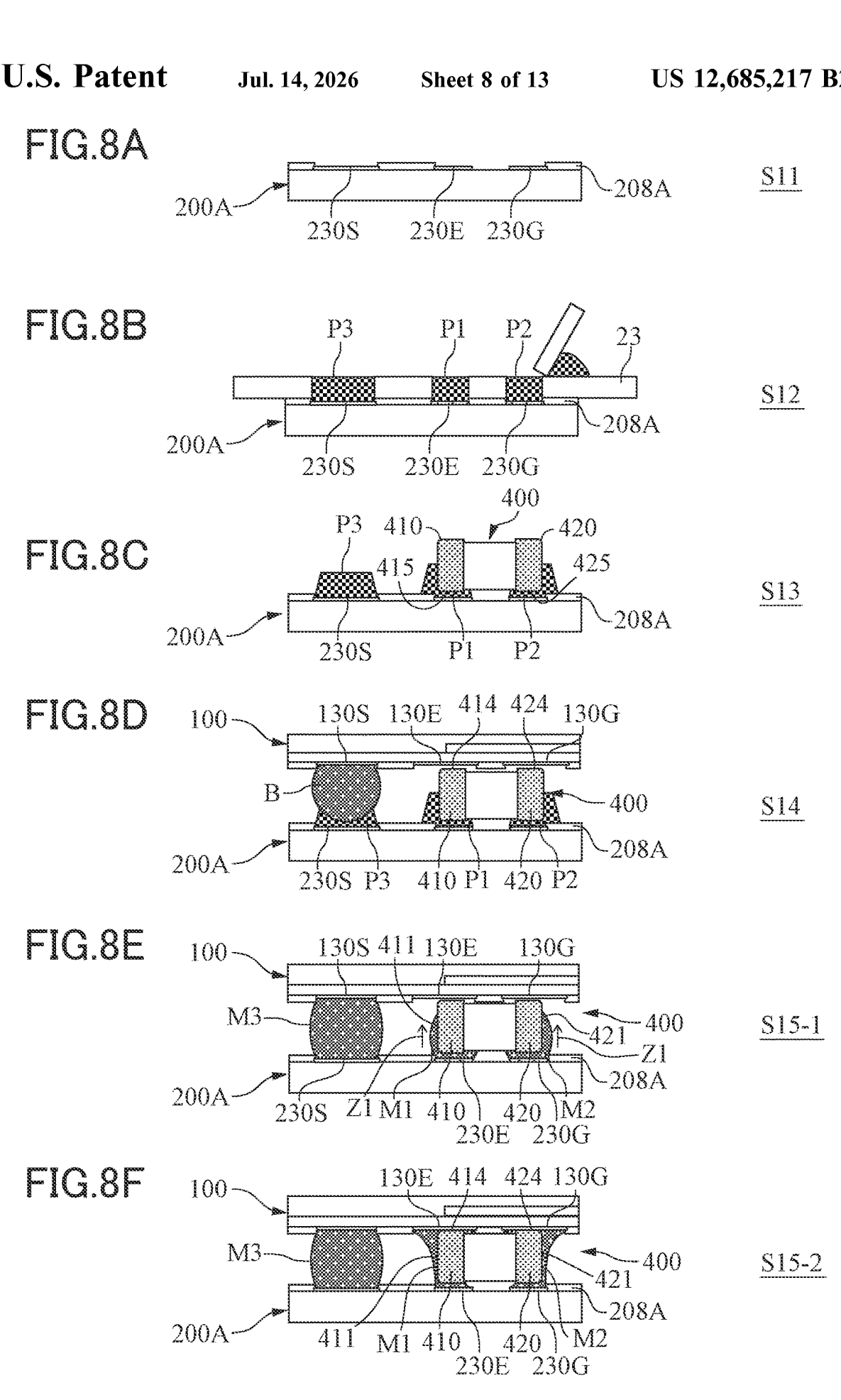
FIG. 8A is a diagram for explaining one stage of a processing module manufacturing method according to the second embodiment.
FIG. 8B is a diagram for explaining one stage of the processing module manufacturing method according to the second embodiment.
FIG. 8C is a diagram for explaining one stage of the processing module manufacturing method according to the second embodiment.
FIG. 8D is a diagram for explaining one stage of the processing module manufacturing method according to the second embodiment.
FIG. 8E is a diagram for explaining one stage of the processing module manufacturing method according to the second embodiment.
FIG. 8F is a diagram for explaining one stage of the processing module manufacturing method according to the second embodiment.

Next, a method of manufacturing the processing module 300A will be described. FIGS. 8A to 8F are explanatory diagrams of a method of manufacturing the processing module 300A according to the second embodiment. As illustrated in FIG. 8A, the printed wiring board 200A is prepared (Step S11). In Step S11, the semiconductor device 100 and the capacitor 400 are also prepared. Next, as illustrated in FIG. 8B, the solder paste P1 which is the first solder paste, the solder paste P2 which is the second solder paste, and the solder paste P3 which is the third solder paste are supplied onto the printed wiring board 200A at intervals (Step S12). In the second embodiment, in Step S12, the solder paste P1 is supplied onto the land 230E exposed by the opening portion HA formed in the solder resist 208A. In addition, the solder paste P2 is supplied onto the land 230G exposed through the opening portion HA formed in the solder resist 208A. In Step S12, the solder paste P3 is supplied onto the land 230S of the printed wiring board 200A.

In Step S12, the solder pastes P1, P2, and P3 are supplied to the printed wiring board 200A by screen printing using the metal mask 23. The method for supplying the solder pastes P1, P2, and P3 is not limited thereto. For example, the solder pastes P1, P2, and P3 may be supplied to the printed wiring board 200A by a dispenser.

Next, as illustrated in FIG. 8C, the capacitor 400 prepared in Step S11 is placed on the printed wiring board 200A such that electrode 410 is in contact with the solder paste P1 and the electrode 420 is in contact with solder paste P2 (Step S13). As a result, the lower surface 415 of the electrode 410 comes into contact with the solder paste P1, and the lower surface 425 of the electrode 420 comes into contact with the solder paste P2. It is not necessary to attach solder balls to the electrodes 410 and 420 of the capacitor 400 in advance.

Next, as illustrated in FIG. 8D, the semiconductor device 100 prepared in Step S11 is mounted on the printed wiring board 200A such that the land 130E faces the electrode 410 and the land 130G faces the electrode 420 (Step S14). In Step S14, the semiconductor device 100 is placed on the printed wiring board 200A to bring the solder balls B, which are ball terminals provided on the lands 130S, into contact with the solder paste P3. In FIG. 8D, the upper surface 414 of the electrode 410 and the land 130E, and the upper surface 424 of the electrode 420 and land 130G are not in contact with each other, but these may be contacted with other.

In Step S14, the positional relationship among the printed wiring board 200A, the capacitor 400, and the semiconductor device 100 when viewed from the Z direction is as illustrated in FIG. 7B. When the capacitor 400 is placed on the printed wiring board 200A, each of the land 130E and the land 130G of the semiconductor device 100 overlaps at least a portion of each of the electrode 410 and the electrode 420 when viewed in the Z direction, and extends outward in the X direction from the capacitor 400.

Next, in a state where the semiconductor device 100 and the capacitor 400 are placed on the printed wiring board 200A, the printed wiring board 200A is conveyed to a reflow furnace (not illustrated). Then, in Step S15-1 illustrated in FIG. 8E, the temperature of the atmosphere in the reflow furnace is adjusted to a temperature equal to or higher than the melting point of the solder, and the solder pastes P1, P2, and P3 and the solder ball B of FIG. 8D are melted as illustrated in FIG. 8E. The solder paste P1 is melted to form a flowable molten solder M1, and the solder paste P2 is melted to form a flowable molten solder M2. When the solder paste P3 and the solder ball B are melted, a flowable molten solder M3 is obtained.

Subsequent to Step S15-1, in Step S15-2 illustrated in FIG. 8F, heating is continued to cause the molten solders M1 and M2 to flow. As illustrated in FIG. 8E, the molten solders M1 and M2 crawl up the side surfaces 411 and 421 in the upward direction indicated by the arrow Z1. Thereafter, the molten solders M1 and M2 move to the upper surfaces 414 and 424 as illustrated in FIG. 8F. Although not illustrated in FIG. 8E, the molten solders M1 and M2 also crawl up in the upward direction indicated by the arrow Z1 on the side surfaces 412 and 413 of the electrode 410 and the side surfaces 422 and 423 of the electrode 420.

In addition, the capacitor 400 is pushed upward toward the semiconductor device 100 by the molten solders M1 and M2, the distance between the upper surface 414 of the electrode 410 and the land 130E is narrowed, and the distance between the upper surface 424 of the electrode 420 and the land 130G is narrowed. The molten solders M1 and M2 reaching the upper surfaces 414 and 424 come into contact with the lands 130E and 130G, wet-spread on the lands 130E and 130G, and have a fillet shape in which the skirt widens as it goes from the solder resist 208A toward the lands 130E and 130G.

Thereafter, the molten solders M1 and M2 wet-spread to every corner of the lands 130E and 130G are cooled and solidified. As a result, the molten solder M1 is cooled and solidified in a fillet shape on the land 130E. The molten solder M2 is cooled and solidified in a fillet shape on the land 130G. At the same time, the molten solder M3 is also cooled and solidified. As a result, the solder bonding portions 191A, 192A, and 193A are formed as illustrated in FIG. 6. As described above, the processing module 300A illustrated in FIG. 6 is manufactured.

Thereafter, the processing module 300A illustrated in FIG. 6 is housed in the casing 611 illustrated in FIG. 1, thereby manufacturing a camera body of a digital camera which is an example of the electronic equipment.

As described above, by melting the solder pastes P1 and P2 supplied to the printed wiring board 200A, the solder can be supplied to the lands 130E and 130G of the semiconductor device 100 via the electrodes 410 and 420 of the capacitor 400. As a result, it is not necessary to form solder balls on the electrodes 410 and 420 of the capacitor 400 in advance, and the process of manufacturing the processing module 300A can be reduced. Therefore, since the processing module 300A can be easily manufactured, productivity of the processing module 300A is improved.

In addition, the land 130E and the land 230E are electrically connected by the solder bonding portion 191A, and the land 130G and the land 230G are electrically connected by the solder bonding portion 192A. As a result, the solder bonding portions 191A and 192A for bonding the capacitor 400 to the semiconductor device 100 can be used as power supply lines for supplying power to the semiconductor element 101 of the semiconductor device 100. This increases the degree of freedom of circuit design in the processing module 300A.

In the second embodiment, as illustrated in FIG. 7B, the areas $S_{130E}$ and $S_{130G}$ of the lands 130E and 130G are larger than the areas $S_{230E}$ and $S_{230G}$ of the lands 230E and 230G when viewed in the Z direction. Since the molten solders M1 and M2 are easily wet-spread in the lands 130E and 130G, it is possible to encourage more of the molten solders M1 and M2 to move to the lands 130E and 130G by utilizing this property. As a result, even if there is a variation in the supply amount of the solder pastes P1 and P2, the allowable amount for the variation in the solder pastes P1 and P2 increases as the areas of the lands 130E and 130G are wider. Therefore, it is possible to prevent generation of side balls and the like in the solder bonding portions 191A and 192A, and as a result, it is possible to prevent short circuit defects in the solder bonding portions 191A and 192A.

Third Embodiment

Figure 9:
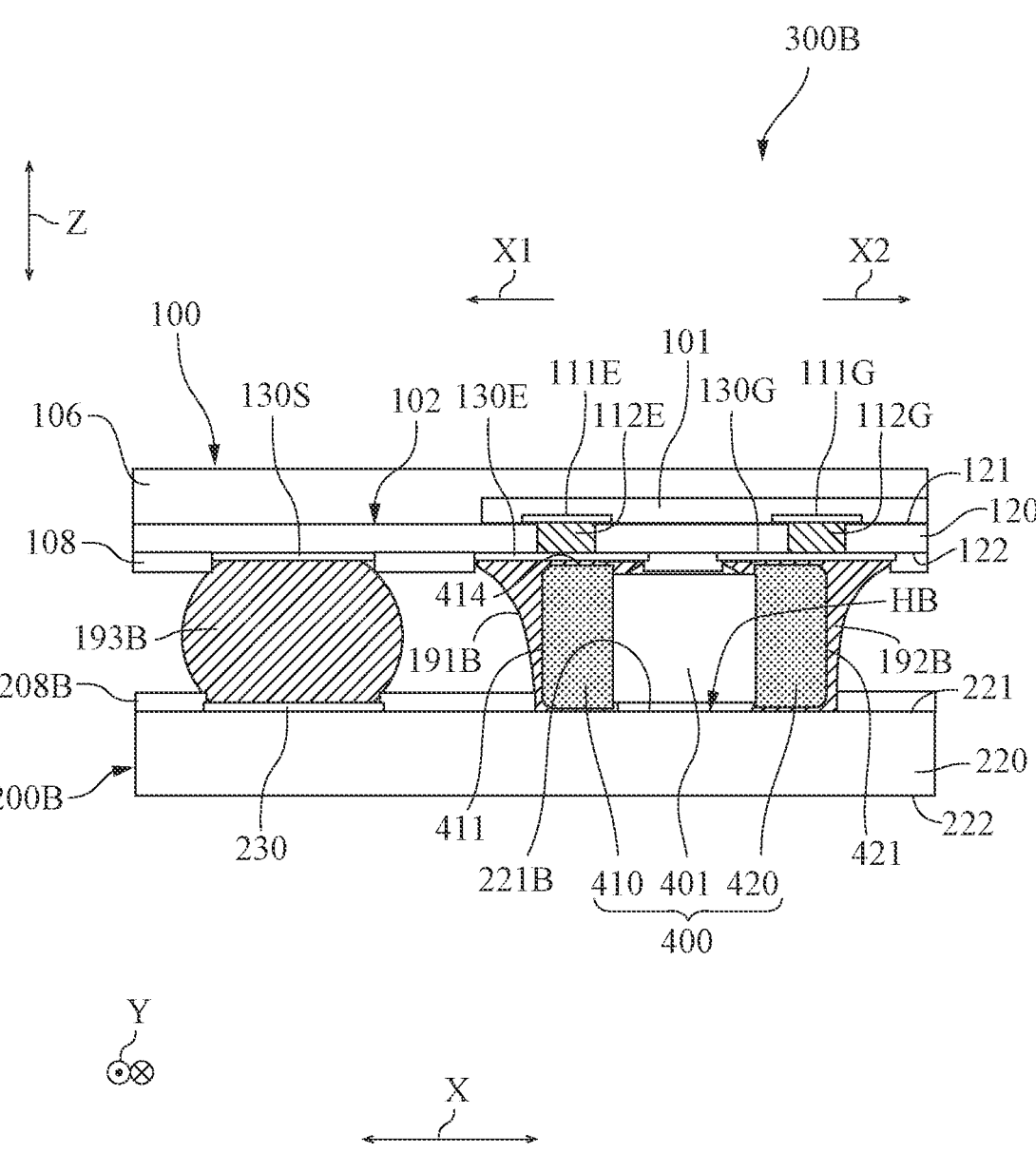
FIG. 9 is a schematic cross-sectional view in which a portion of a processing module according to a third embodiment is enlarged.

A third embodiment will be described. FIG. 9 is a schematic cross-sectional view in which a portion of the processing module according to the third embodiment is enlarged. FIG. 9 schematically illustrates a cross section of a processing module 300B according to the third embodiment. In the following description, the same components as those of the first embodiment are denoted by the same reference numerals, and detailed description thereof will be omitted.

The processing module 300B according to the third embodiment includes the semiconductor device 100 having the same configuration as that of the first embodiment and a printed wiring board 200B. Similarly to the first embodiment, the land 130E that is the first land, the land 130G that is the second land, and the land 130S that is the fifth land are arranged on the main surface 122 of the insulating substrate 120 included in the semiconductor device 100.

The printed wiring board 200B has the insulating substrate 220 similar to that of the first embodiment. The insulating substrate 220 has a main surface 221 and a main surface 222 opposite to the main surface 221. The land 230 is disposed on the main surface 221 of the insulating substrate 220 as in the first embodiment.

The printed wiring board 200B includes a solder resist 208B. The solder resist 208B is a film made of a solder resist material. The solder resist 208B is provided on the main surface 221. The land 230 is exposed through an opening portion formed in the solder resist 208B.

The processing module 300B includes the capacitor 400 used as a bypass capacitor as in the first embodiment. The capacitor 400 is disposed on the main surface 221 side of the insulating substrate 220 of the printed wiring board 200B, that is, between the semiconductor device 100 and the printed wiring board 200B. The electrode 410 of the capacitor 400 is bonded to the land 130E by a solder bonding portion 191B that is a first solder bonding portion formed of solder. The electrode 420 of the capacitor 400 is bonded to the land 130G by a solder bonding portion 192B that is a second solder bonding portion made of solder. Thus, the electrode 410 of the capacitor 400 is electrically connected directly to the land 130E of the semiconductor device 100 by the solder bonding portion 191B. Therefore, the inductance of the wire between the electrode 410 of the capacitor 400 and the land 130E can be reduced. The electrode 420 of the capacitor 400 is electrically connected directly to the land 130G of the semiconductor device 100 by the solder bonding portion 192B. Therefore, the inductance of the wire between the electrode 420 of the capacitor 400 and the land 130G can be reduced. Since the inductance of the wire is reduced, the generated power supply noise is reduced, and a speed of communication in the semiconductor device 100 can be increased.

The land 130S and land 230 are bonded to each other by a solder bonding portion 193B that is a third solder bonding portion made of solder. In the third embodiment, the solder resist 208B has an opening portion HB that exposes a portion 221B of the main surface 221.

Figure 10A:
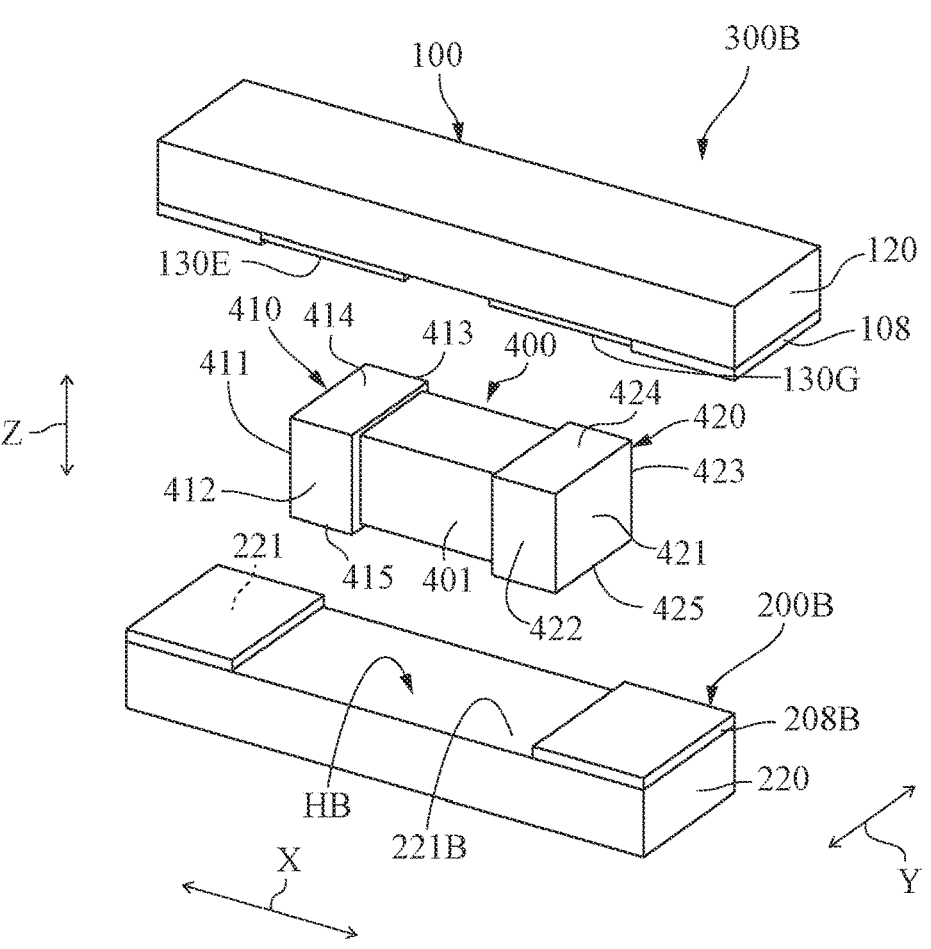
FIG. 10A is an exploded partial perspective view of the processing module according to the third embodiment.
Figure 10B:
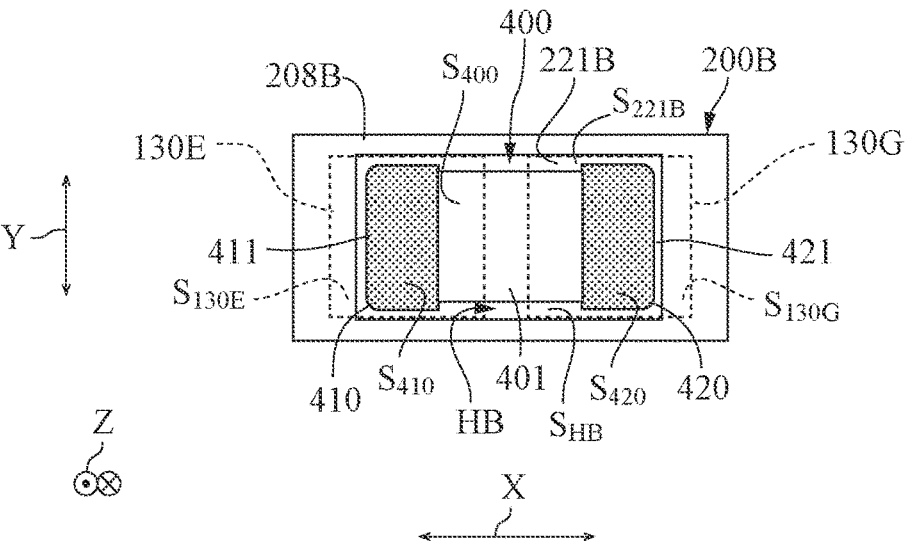
FIG. 10B is a schematic diagram for explaining an arrangement relationship among a semiconductor device, a capacitor, and a printed wiring board according to the third embodiment.

FIG. 10A is an exploded partial perspective view of the processing module 300B according to the third embodiment. FIG. 10B is a schematic diagram for explaining an arrangement relationship of the semiconductor device 100, the capacitor 400, and the printed wiring board 200B when viewed in the Z direction. In FIGS. 10A and 10B, the solder bonding portions 191B and 192B are not illustrated. In FIG. 10B, the lands 130E and 130G of the semiconductor device are indicated by broken lines.

As illustrated in FIG. 10A, the upper surface 414 of the electrode 410 faces the land 130E of the semiconductor device 100, and the lower surface 415 of the electrode 410 faces the portion 221B of the main surface 221 of the printed wiring board 200B. The upper surface 424 of the electrode 420 faces the land 130G of the semiconductor device 100, and the lower surface 425 of the electrode 420 faces the portion 221B of the printed wiring board 200B.

As illustrated in FIG. 10B, the land 130E and the land 130G are arranged at intervals in the X direction. The land 130E overlaps at least a portion of the electrode 410 of the capacitor 400, the entire electrode 410 in the third embodiment in a plan view, that is, viewed in the Z direction. When viewed in the Z direction, the land 130G overlaps at least a portion of the electrode 420 of the capacitor 400, and the entire electrode 420 in the third embodiment. In the third embodiment, the area $S_{130E}$ of the land 130E is larger than the area $S_{410}$ of the electrode 410 as viewed in the Z direction. When viewed in the Z direction, an area $S_{130G}$ of the land 130G is larger than an area $S_{420}$ of the electrode 420. The land 130E and the land 130G extend outward in the X direction from the capacitor 400 when viewed in the Z direction.

As illustrated in FIG. 9, each of the solder bonding portions 191B and 192B has a fillet shape in which the outer surface expands away from the capacitor 400 as each of the solder bonding portions 191B and 192B extends from the portion 221B exposed by the opening portion HB toward each of the lands 130E and 130G. More specifically, the solder bonding portion 191B has a fillet shape expanding outward in the X direction from the electrode 410, that is, in the X1 direction, as the solder bonding portion 191B extends from the portion 221B exposed by the opening portion HB toward the land 130E. The solder bonding portion 192B has a fillet shape that expands outward in the X direction from the electrode 420, that is, in the X2 direction, as the solder bonding portion 192B extends from the portion 221B exposed by the opening portion HB toward the land 130G. The X1 direction is a direction away from the electrode 410 in the X direction. The X2 direction is a direction opposite to the X1 direction in the X direction and is a direction away from the electrode 420. As a result, the bonding strength between each of the lands 130E and 130G and each of the electrodes 410 and 420 increases. In addition, each of the solder bonding portions 191B and 192B is prevented from having a shape bulging in the X direction, and each of the solder bonding portions 191B and 192B is prevented from being short-circuited with the adjacent solder bonding portion 193B.

In the third embodiment, as illustrated in FIG. 10B, the area $S_{HB}$ of the opening portion HB, that is, the area $S_{221B}$ of the portion 221B exposed by the opening portion HB is larger than the area $S_{400}$ of the capacitor 400 as viewed in the Z direction. Therefore, as illustrated in FIG. 9, a portion of the capacitor 400 in the Z direction is inserted into the opening portion HB, and the distance between the semiconductor device 100 and the printed wiring board 200B is narrowed.

Next, a method of manufacturing the processing module 300B will be described. FIGS. 11A to 11F are explanatory diagrams of the method of manufacturing the processing module 300B according to the third embodiment. As illustrated in FIG. 11A, the printed wiring board 200B is prepared (Step S21). In Step S21, the semiconductor device 100 and the capacitor 400 are also prepared. Next, as illustrated in FIG. 11B, the solder paste P1 which is the first solder paste, the solder paste P2 which is the second solder paste, and the solder paste P3 which is the third solder paste are supplied onto printed wiring board 200B at intervals (Step S22). In the third embodiment, in Step S22, the solder pastes P1 and P2 are supplied onto the portion 221B exposed by the opening portion HB formed in the solder resist 208B at intervals. In Step S22, the solder paste P3 is supplied onto the land 230 of the printed wiring board 200B.

In Step S22, the solder pastes P1, P2, and P3 are supplied to the printed wiring board 200B by screen printing using the metal mask 23. The method for supplying the solder pastes P1, P2, and P3 is not limited thereto. For example, the solder pastes P1, P2, and P3 may be supplied to the printed wiring board 200B by a dispenser.

Next, as illustrated in FIG. 11C, the capacitor 400 prepared in Step S21 is placed on printed wiring board 200B such that the electrode 410 is in contact with the solder paste P1 and the electrode 420 is in contact with the solder paste P2 (Step S23). As a result, the lower surface 415 of the electrode 410 comes into contact with the solder paste P1, and the lower surface 425 of the electrode 420 comes into contact with the solder paste P2. It is not necessary to attach solder balls to the electrodes 410 and 420 of the capacitor 400 in advance.

Next, as illustrated in FIG. 11D, the semiconductor device 100 prepared in Step S21 is mounted on the printed wiring board 200B such that the land 130E faces the electrode 410 and the land 130G faces the electrode 420 (Step S24). In Step S24, the semiconductor device 100 is placed on the printed wiring board 200B to bring the solder balls B, which are ball terminals provided on the lands 130S, into contact with the solder paste P3. In FIG. 11D, the upper surface 414 of the electrode 410 and the land 130E, and the upper surface 424 of the electrode 420 and the land 130G are not in contact with each other, but these may be in contact with each other.

In Step S24, the positional relationship among the printed wiring board 200B, the capacitor 400, and the semiconductor device 100 as viewed from the Z direction is as illustrated in FIG. 10B. When the capacitor 400 is placed on the printed wiring board 200B, each of the land 130E and the land 130G of the semiconductor device 100 overlaps at least a portion of each of the electrode 410 and the electrode 420 when viewed in the Z direction, and extends outward in the X direction from the capacitor 400.

Next, in a state where the semiconductor device 100 and the capacitor 400 are placed on the printed wiring board 200B, the printed wiring board 200B is conveyed to a reflow furnace (not illustrated). Then, in Step S25-1 illustrated in FIG. 11E, the temperature of the atmosphere in the reflow furnace is adjusted to a temperature equal to or higher than the melting point of the solder, and the solder pastes P1, P2, and P3 and the solder ball B in FIG. 11D are melted as illustrated in FIG. 11E. The solder paste P1 is melted to form a flowable molten solder M1, and the solder paste P2 is melted to form a flowable molten solder M2. When the solder paste P3 and the solder ball B are melted, a flowable molten solder M3 is obtained.

Subsequent to Step S25-1, in Step S25-2 illustrated in FIG. 11F, heating is continued to cause the molten solders M1 and M2 to flow. As illustrated in FIG. 11E, the molten solders M1 and M2 crawl up the side surfaces 411 and 421 in the upward direction indicated by the arrow Z1. Thereafter, the molten solders M1 and M2 move to the upper surfaces 414 and 424 as illustrated in FIG. 11F. Although not illustrated in FIG. 11, the molten solders M1 and M2 also crawl up in the upward direction indicated by the arrow Z1 on the side surface 412,413 of the electrode 410 and the side surfaces 422 and 423 of the electrode 420.

In addition, the capacitor 400 is pushed upward toward the semiconductor device 100 by the molten solders M1 and M2, the distance between the upper surface 414 of the electrode 410 and the land 130E is narrowed, and the distance between the upper surface 424 of the electrode 420 and the land 130G is narrowed. The molten solders M1 and M2 reaching the upper surfaces 414 and 424 come into contact with the lands 130E and 130G, wet-spread on the lands 130E and 130G, and have a fillet shape in which the skirt widens as it goes from the solder resist 208B toward the lands 130E and 130G.

Thereafter, the molten solders M1 and M2 wet-spread to the lands 130E and 130G are cooled and solidified. As a result, the molten solder M1 is cooled and solidified in a fillet shape on the land 130E. The molten solder M2 is cooled and solidified in a fillet shape on the land 130G. At the same time, the molten solder M3 is also cooled and solidified. As a result, solder bonding portions 191B, 192B, and 193B are formed as illustrated in FIG. 9. As described above, the processing module 300B illustrated in FIG. 9 is manufactured.

Thereafter, the processing module 300B illustrated in FIG. 9 is housed in the casing 611 illustrated in FIG. 1, thereby manufacturing a camera body of a digital camera which is an example of the electronic equipment.

As described above, by melting the solder pastes P1 and P2 supplied to the printed wiring board 200B, the solder can be supplied to the lands 130E and 130G of the semiconductor device 100 via the electrode 410,420 of the capacitor 400. As a result, it is not necessary to form solder balls on the electrodes 410,420 of the capacitor 400 in advance, and the process of manufacturing the processing module 300B can be reduced. Therefore, since the processing module 300B can be easily manufactured, productivity of the processing module 300B is improved.

In the third embodiment, since a portion of the capacitor 400 is inserted into the opening portion HB, the height of the solder bonding portions 191B, 192B, and 193B in the Z direction, that is, the interval between the semiconductor device 100 and the printed wiring board 200B in the Z direction can be narrowed. Therefore, the amount of solder in the solder bonding portions 191B, 192B, and 193B can be reduced, and the manufacturing cost of the processing module 300B can be reduced.

Example 1

Example 1 corresponding to the first embodiment will be described. In the semiconductor device 100 illustrated in FIG. 3, a minimum pitch of the solder balls B (FIG. 5D), which are two adjacent unbonded ball terminals, was 0.4 [mm]. A material of the land 130 was Cu. A material of each of the solder bonding portion 191, 192, and 193 was Sn-3.0% Ag 0.5% Cu. The area $S_{400}$ of the capacitor 400 as viewed from the Z direction illustrated in FIG. 4B was 0.4 [mm]×0.2 [mm]. That is, the capacitor 400 was a 0402 chip component.

A thickness of the metal mask 23 illustrated in FIG. 5B used in the manufacturing process of the processing module 300 was set to 0.08 [mm] from the minimum pitch of the solder balls B, which are the two adjacent ball terminals before bonding in the semiconductor device 100, and the size of the capacitor 400.

In Steps S5-1 and S5-2 illustrated in FIGS. 5E and 5F, the solder pastes P1, P2, and P3 were melted at a peak temperature of the atmosphere in the reflow furnace of 230° C. or higher. Thereafter, the molten solders M1, M2, and M3 were cooled and solidified. It was confirmed that the capacitor 400 was bonded to the semiconductor device 100 by the solder bonding portion 191,192. The solder bonding portion 191,192 had a fillet shape on the lands 130E and 130G.

The movement of the molten solders M1, M2, and M3 in Steps S5-1 and S5-2 was confirmed as follows by observation. First, the solder paste P3 and the solder ball B are integrally melted. At this time, the semiconductor device 100 moves toward the printed wiring board 200 by the molten solder M3 to be rounded. Meanwhile, since the molten solders M1 and M2 are not in contact with the land of the printed wiring board 200, the molten solders M1 and M2 move to the electrode 410,420 of the capacitor 400 and reach the upper surfaces 414 and 424 along the side surfaces 411 and 412. The capacitor 400 is raised with respect to the surface of the solder resist 208 by the molten solders M1 and M2. The raised amount depends on the amounts of the solder pastes P1 and P2, but was about 0.01 to 0.015 [mm] in Example 1. As a result, the upper surfaces 414 and 424 of the capacitor 400 are brought close to the lands 130E and 130G. The molten solders M1 and M2 reaching the upper surfaces 414 and 424 come into contact with the lands 130E and 130G, and wet-spread on the lands 130E and 130G. The movement of the molten solders M1, M2, and M3 as described above forms the solder bonding portion 191,192 having a fillet shape on the lands 130E and 130G.

Example 2

Example 2 corresponding to the second embodiment will be described. In the semiconductor device 100 illustrated in FIG. 6, a minimum pitch of the solder balls B (FIG. 8D), which are two adjacent unbonded ball terminals, was 0.4 [mm]. A material of the land 130 was Cu. The solder bonding portions 191A, 192A, and 193A were made of Sn-3.0% Ag 0.5% Cu. The area $S_{400}$ of the capacitor 400 as viewed from the Z direction illustrated in FIG. 7B was 0.4 [mm]×0.2 [mm]. That is, the capacitor 400 was a 0402 chip component.

The sizes of the lands 130E and 130G in the semiconductor device 100 as viewed from the Z direction were set to 0.6 [mm]×0.22 [mm]. The sizes of the lands 230E and 230G in the printed wiring board 200A viewed from the Z direction were set to 0.5 [mm]×0.2 [mm]. The areas $S_{130E}$ and $S_{130G}$ of the lands 130E and 130G were 0.132 mm². The areas $S_{230E}$ and $S_{230G}$ of the lands 230E and 230G were 0.1 mm². As described above, the relationship between the areas $S_{130E}$ and $S_{130G}$ of the lands 130E and 130G and the areas $S_{230E}$ and $S_{230G}$ of the lands 230E and 230G is set as $S_{230E}$ and $S_{230G} < S_{130E}$ and $S_{130G}$.

The amount of the solder pastes P1 and P2 was increased as compared with Example 1, and in order to confirm the fillet shape, the thickness of the metal mask 23 used in Step S12 illustrated in FIG. 8B was set to 0.10 [mm] thicker than 0.08 [mm].

Since the areas $S_{130E}$ and $S_{130G}$ of the lands 130E and 130G are larger than the areas $S_{230E}$ and $S_{230G}$ of the lands 230E and S230G, the molten solders M1 and M2 wet-spread to the large areas of the lands 130E and 130G in Steps S15-1 and S15-2. Therefore, in Example 2, it was confirmed that generation of side balls and swelling of fillets were prevented in the solder bonding portions 191A and 192A, and short circuit defects were prevented.

Example 3

Next, a third example will be described. Example 3 corresponds to the first embodiment, but the materials of the lands 130E and 130G are different from those of Example 1.

The wettability of the molten solder in the lands 130E and 130G of the semiconductor device 100 is F1, and the wettability of the molten solder in the electrode 410,420 of the capacitor 400 is F2. In Example 3, the materials of the lands 130E and 130G of the semiconductor device 100 and the electrode 410,420 of the capacitor 400 were selected so as to satisfy a relationship of F1≥F2. The wettability of the molten solder refers to ease of fitting of the molten solder.

In order for the molten solder to wet-spread on the surface of the electrode 410,420 of the capacitor 400 and the surfaces of the lands 130E and 130G of the semiconductor device 100, it is important that the surfaces of the molten solder and the target metal are not contaminated. As the molten solder and the metal surface are cleaner, the interatomic distance therebetween becomes closer, and the molten solder wets and spreads on the metal surface so as to be in close contact with the metal surface. For this reason, the lands 130E and 130G of the semiconductor device 100 are subjected to Au plating which is hardly oxidized. In addition, the electrode 410,420 of the capacitor 400 is plated with Sn which is easily oxidized and has a low reduction rate.

The thickness of the metal mask 23 illustrated in FIG. 5B was set to 0.05 [mm]. The supply amounts of the solder pastes P1, P2, and P3 were smaller than those in Example 1. The sizes of the semiconductor device 100 and the capacitor 400 were the same as those in Example 1.

In Steps S5-1 and S5-2 in FIGS. 5E and 5F, it was confirmed that the molten solders M1 and M2 moved from the Sn-plated electrode 410,420 to the lands 130E and 130G on which the Au plating with high wettability was applied. As a result, it was confirmed that the capacitor 400 was favorably bonded to the semiconductor device 100 by the solder bonding portion 191,192.

(Calculation of Inductance)

Figure 12A:
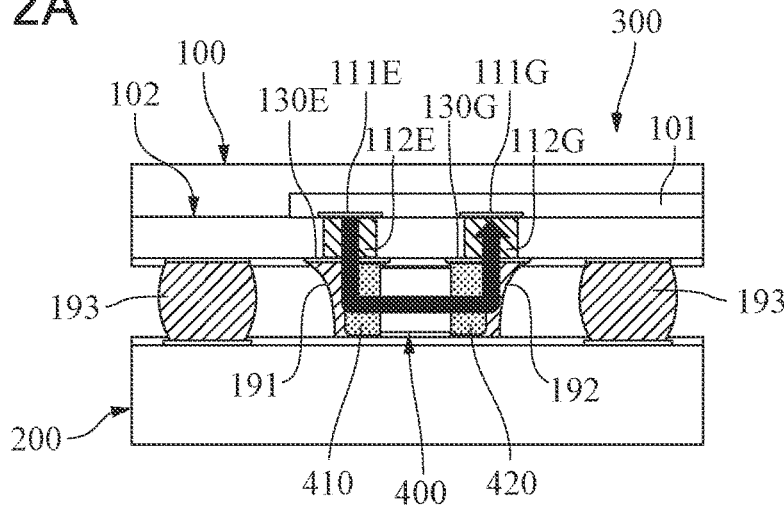
FIG. 12A is a schematic cross-sectional view of a processing module of Example 1.
Figure 12B:
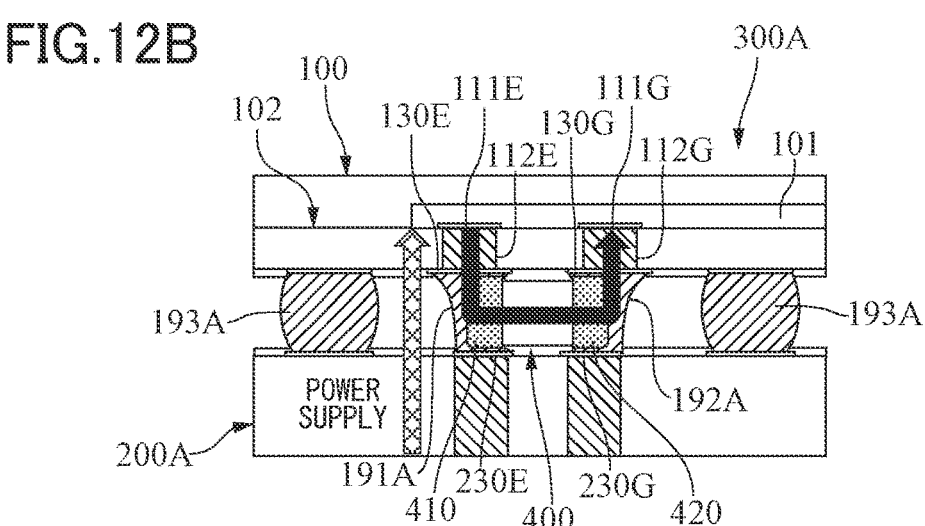
FIG. 12B is a schematic cross-sectional view of a processing module of Example 2.
Figure 12C:
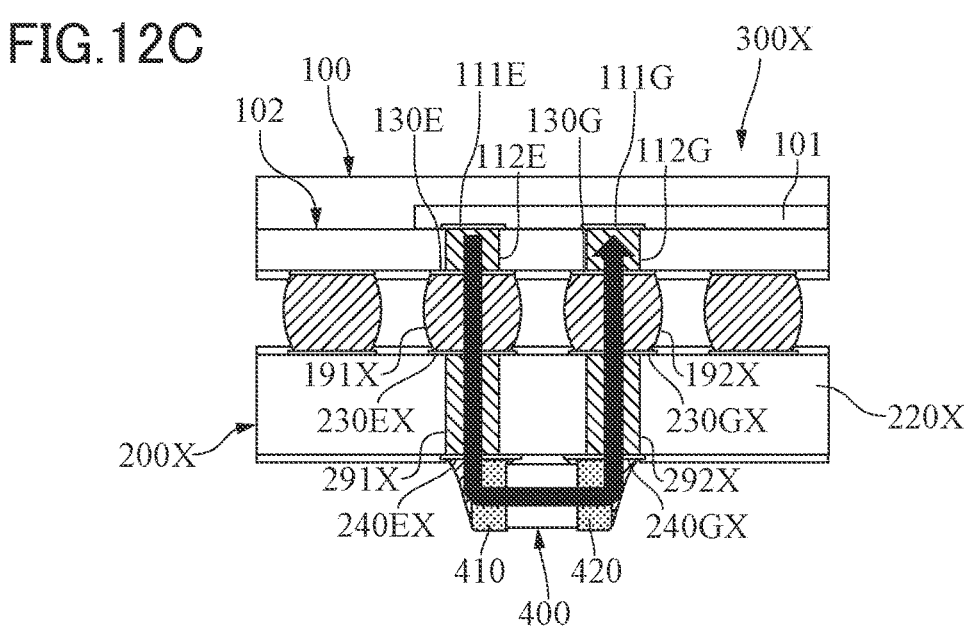
FIG. 12C is a schematic cross-sectional view of a processing module of Comparative Example 1.

Next, the inductance of the wiring between the semiconductor element and the capacitor was calculated for Example 1, Example 2, and Comparative Example 1. FIG. 12A is a schematic cross-sectional view of the processing module 300 of Example 1. FIG. 12B is a schematic cross-sectional view of the processing module 300A of Example 2. FIG. 12C is a schematic cross-sectional view of a processing module 300X of Comparative Example 1.

The processing module 300X of Comparative Example 1 illustrated in FIG. 12C includes the semiconductor device 100, the capacitor 400, and a printed wiring board 200X. The semiconductor device 100 includes the semiconductor element 101 and the package substrate 102. The semiconductor element 101 is mounted on the package substrate 102. The package substrate 102 includes the land 130E and a land 130G.

The printed wiring board 200 includes an insulating substrate 220X. The insulating substrate 220X has one main surface and the other main surface opposite to the one main surface. Land 230EX and land 230GX are disposed on one main surface of the insulating substrate 220X. Land 130E and land 230EX are bonded by a solder bonding portion 191X. Land 130G and land 230GX are bonded by a solder bonding portion 192X.

The capacitor 400 is disposed on the other main surface side of the insulating substrate 220X of the printed wiring board 200X. A land 240EX bonded to the electrode 410 of the capacitor 400 by solder and a land 240GX bonded to the electrode 420 of the capacitor 400 by solder are disposed on the other main surface of the insulating substrate 220X. The land 230EX and the land 240EX are electrically connected by a via conductor 291X formed on the insulating substrate 220X. The land 230GX and the land 240GX are electrically connected by the via conductor 292X formed on the insulating substrate 220X.

Calculation conditions are illustrated below. In the semiconductor device 100 which is a BGA semiconductor package, the pitch between two adjacent ball terminals was set to 0.4 [mm]. The thickness of the package substrate 102 was set to 0.4 [mm]. Each of the solder bonding portions 193, 193A, 191X, and 192X had a height of 0.220 [mm] and a width of 0.250 [mm]. The capacitor 400 was a 0402 size chip capacitor. The thickness of each of the printed wiring boards 200, 200A, 200X was set to 0.8 [mm]. For the calculation of the inductance, a calculation formula of the inductance in the parallel conducting wire was used.

A calculation result of Example 1 illustrated in FIG. 12A will be described. The inductance value of each of the via conductors 112E and 112G in the package substrate 102 was 266 pH. Each of the inductance value between the electrode 410 of the capacitor 400 and the land 130E and the inductance value between the electrode 420 of the capacitor 400 and the land 130G was 180 pH. Therefore, each of the inductance value between the power terminal 111E of the semiconductor element 101 and the electrode 410 of the capacitor 400 and the inductance value between the ground terminal 111G of the semiconductor element 101 and the electrode 420 of the capacitor 400 was 466 pH. The calculation result of Example 2 illustrated in FIG. 12B was similar to that of Example 1.

A calculation result of Comparative Example 1 illustrated in FIG. 12C will be described. The inductance value of each of the via conductors 112E and 112G in the package substrate 102 was 266 pH. The inductance value of each of the solder bonding portions 191X and 192X was 42 pH. The inductance value of each of the via conductors 291X and 292X in the printed wiring board 200X was 545 pH. Each of the inductance value between the electrode 410 of the capacitor 400 and the land 240EX and the inductance value between the electrode 420 of the capacitor 400 and the land 240GX was 180 pH. Therefore, each of the inductance value between the power terminal 111E of the semiconductor element 101 and the electrode 410 of the capacitor 400 and the inductance value between the ground terminal 111G of the semiconductor element 101 and the electrode 420 of the capacitor 400 was 1033 pH.

Figure 13:
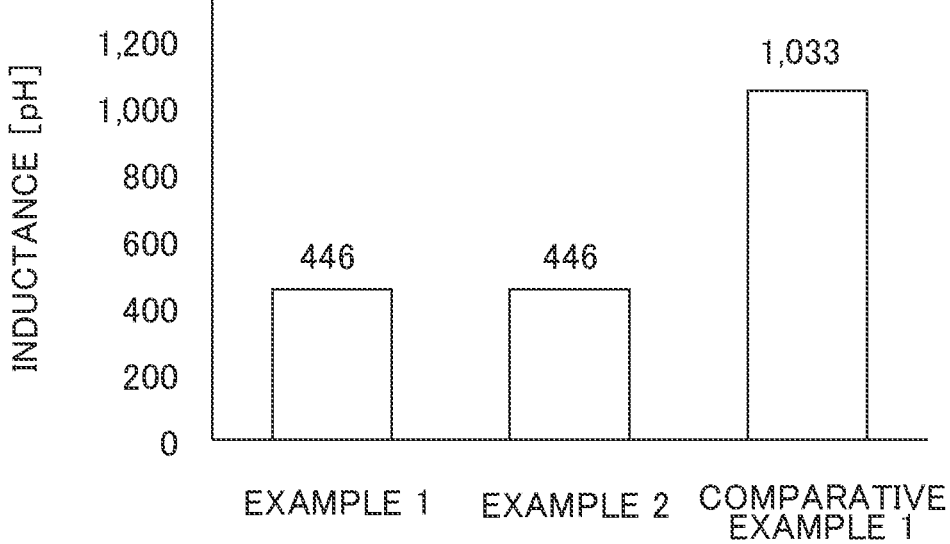
FIG. 13 is a graph illustrating calculation results of inductances in Example 1, Example 2, and Comparative Example 1.

FIG. 13 illustrates calculation results of inductances in Example 1, Example 2, and Comparative Example 1. As illustrated in FIG. 13, in Examples 1 and 2, the inductance value is smaller than that of Comparative Example 1. As a result, the generated power supply noise is reduced, and it is possible to realize high-speed communication in the semiconductor device 100. In Example 2, as illustrated in FIG. 12B, the semiconductor device 100 and the printed wiring board 200A are connected by the solder bonding portions 191A and 192A via the capacitor 400. As a result, power can be supplied to the semiconductor element 101 via the solder bonding portions 191A and 192A. Therefore, the land 130S can be used for applications other than the power supply line, and the degree of freedom in circuit design is increased.

As described above, it is possible to manufacture a processing module that realizes high-speed communication without adding a manufacturing process.

Note that the present invention is not limited to the embodiments described above, and many modifications can be made within the technical idea of the present invention. In addition, the effects described in the embodiments merely enumerate the most suitable effects resulting from the present invention, and the effects according to the present invention are not limited to those described in the embodiments.

In the above-described embodiments, the case where the electronic component is the capacitor 400 has been described, but the present invention is not limited thereto. The electronic component may be a passive component such as a resistor or an inductor.

In the above-described embodiments, the semiconductor device 100 in which the solder balls B are provided on the land 230S is prepared in advance, but the present invention is not limited thereto. That is, in the step of preparing the semiconductor device 100, the solder balls S may be provided on the land 230S.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A semiconductor module comprising:
   a printed wiring board;
   a semiconductor device comprising a first land and a second land, the semiconductor device being mounted on the printed wiring board;
   a chip component comprising a first electrode and a second electrode spaced apart from each other in a predetermined direction, the chip component being disposed between the printed wiring board and the semiconductor device;
   a first solder bonding portion that bonds the first electrode and the first land to each other; and
   a second solder bonding portion that bonds the second electrode and the second land to each other,
   wherein the printed wiring board comprises an insulating substrate and a solder resist disposed on a main surface of the insulating substrate,
   wherein the chip component faces the solder resist,
   wherein each of the first land and the second land overlaps at least a portion of each of the first electrode and the second electrode in a plan view and extends outward in the predetermined direction from the chip component,
   wherein the first solder bonding portion has a fillet shape in which the first solder bonding portion spreads outward in the predetermined direction such that the first solder bonding portion extends longer in the predetermined direction in a part of the first solder bonding portion that is adjacent to the first land than in a part of the first solder bonding portion that is most distant from the first land, and
   wherein wettability of the first land with molten solder is higher than wettability of the first electrode with molten solder.

2. The semiconductor module according to claim 1, wherein the first land is a power terminal, and the second land is a ground terminal.

3. The semiconductor module according to claim 1, wherein the chip component is a chip component of 0402 size or less.

4. The semiconductor module according to claim 1, wherein the chip component is a capacitor.

5. The semiconductor module according to claim 1, wherein the semiconductor device is a BGA semiconductor package in which an interval between lands is 0.4 mm or less.

6. The semiconductor module according to claim 1, wherein the semiconductor device comprises a semiconductor element, and the semiconductor element and the chip component overlap each other in a plan view of the semiconductor module.

7. The semiconductor module according to claim 1, further comprising, a third solder bonding portion that bonds a fifth land and a sixth land, wherein the semiconductor device comprises the fifth land, wherein the printed wiring board comprises the sixth land on a main surface of the insulating substrate, and wherein a height of the third solder bonding portion is greater than a height of the chip component.

8. Electronic equipment comprising:

a casing; and the semiconductor module according to claim 1 disposed inside the casing.

9. The semiconductor module according to claim 1, wherein the second solder bonding portion has a fillet shape in which the second solder bonding portion spreads outward in the predetermined direction such that the second solder bonding portion extends longer in the predetermined direction in a part of the second solder bonding portion that is adjacent to the second land than in a part of the second solder bonding portion that is most distant from the second land, and wherein wettability of the second land with molten solder is higher than wettability of the second electrode with molten solder.

10. A semiconductor module comprising:

a printed wiring board;

a semiconductor device comprising a first land and a second land, the semiconductor device being mounted on the printed wiring board;

a chip component comprising a first electrode and a second electrode spaced apart from each other in a predetermined direction, the chip component being disposed between the printed wiring board and the semiconductor device;

a first solder bonding portion that bonds the first electrode and the first land to each other; and a second solder bonding portion that bonds the second electrode and the second land to each other, wherein the printed wiring board comprises an insulating substrate, a third land disposed on a main surface of the insulating substrate and electrically connected to the first land by the first solder bonding portion, and a fourth land disposed on the main surface of the insulating substrate and electrically connected to the second land by the second solder bonding portion, wherein, in a plan view, each of the first land and the second land overlaps at least a portion of each of the first electrode and the second electrode, overlaps at least a portion of each of the third land and the fourth land, and extends outward in the predetermined direction from the chip component, wherein the first solder bonding portion has a fillet shape in which the first solder bonding portion spreads outward in the predetermined direction such that the first solder bonding portion extends longer in the predetermined direction in a part of the first solder bonding portion that is adjacent to the first land than in a part of the first solder bonding portion that is adjacent to the third land, and wherein, in a plan view, an area of the first land is larger than an area of the third land.

11. The semiconductor module according to claim 10, wherein the second solder bonding portion has a fillet shape in which the second solder bonding portion spreads outward in the predetermined direction such that the second solder bonding portion extends longer in the predetermined direction in a part of the second solder bonding portion that is adjacent to the second land than in a part of the second solder bonding portion that is adjacent to the fourth land, and wherein in a plan view, an area of the second land is larger than area of the fourth land.

12. A semiconductor module comprising:

a printed wiring board;

a semiconductor device comprising a first land and a second land, the semiconductor device being mounted on the printed wiring board;

a chip component comprising a first electrode and a second electrode spaced apart from each other in a predetermined direction, the chip component being disposed between the printed wiring board and the semiconductor device;

a first solder bonding portion that bonds the first electrode and the first land to each other; and a second solder bonding portion that bonds the second electrode and the second land to each other, wherein the printed wiring board comprises an insulating substrate and a solder resist disposed on a main surface of the insulating substrate, wherein the solder resist has an opening portion into which a portion of the chip component is inserted, wherein each of the first land and the second land overlaps at least a portion of each of the first electrode and the second electrode in a plan view and extends outward in the predetermined direction from the chip component, wherein the first solder bonding portion has a fillet shape in which the first solder bonding portion spreads outward in the predetermined direction such that the first solder bonding portion extends longer in the predetermined direction in a part of the first solder bonding portion that is adjacent to the first land than in a part of the first solder bonding portion that is adjacent to the portion of the main surface of the insulating substrate exposed by the opening portion of the solder resist, and wherein wettability of the first land with molten solder is higher than wettability of the first electrode with molten solder.

13. The semiconductor module according to claim 12, wherein the second solder bonding portion has a fillet shape in which the second solder bonding portion spreads outward in the predetermined direction such that the second solder bonding portion extends longer in the predetermined direction in a part of the second solder bonding portion that is adjacent to the second land than in a part of the second solder bonding portion that is adjacent to the portion of the main surface of the insulating substrate exposed by the opening portion of the solder resist, and wherein wettability of the second land with molten solder is higher than wettability of the second electrode with molten solder.

* * * * *